United States Patent
Kato et al.

(10) Patent No.: US 7,449,817 B2
(45) Date of Patent: Nov. 11, 2008

(54) ACTUATOR AND METHOD OF MANUFACTURING ACTUATOR MODULE

(75) Inventors: Midori Kato, Asaka (JP); Masayoshi Ishibashi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 17 days.

(21) Appl. No.: 11/604,688

(22) Filed: Nov. 28, 2006

(65) Prior Publication Data

US 2007/0120444 A1    May 31, 2007

(30) Foreign Application Priority Data

Nov. 30, 2005    (JP)    ............... 2005-345211

(51) Int. Cl.
    *H01L 41/08*    (2006.01)
(52) U.S. Cl. .............. 310/331; 310/330; 310/800
(58) Field of Classification Search ......... 310/330–332, 310/800
    See application file for complete search history.

(56) References Cited

U.S. PATENT DOCUMENTS

| | | | | |
|---|---|---|---|---|
| 5,977,685 | A * | 11/1999 | Kurita et al. | ............... 310/311 |
| 6,067,797 | A * | 5/2000 | Silverbrook | .................. 60/528 |
| 7,011,394 | B2 * | 3/2006 | Cabal et al. | .................... 347/54 |
| 7,038,357 | B2 * | 5/2006 | Goldenberg et al. | ........ 310/328 |
| 7,175,208 | B2 * | 2/2007 | Belcher | ....................... 285/249 |
| 2004/0070314 | A1 * | 4/2004 | Yoon et al. | ................... 310/330 |
| 2004/0232807 | A1 * | 11/2004 | Pelrine et al. | ............... 310/800 |
| 2005/0136321 | A1 * | 6/2005 | Bailey | .......................... 429/72 |
| 2006/0038103 | A1 * | 2/2006 | Helmbrecht | ........... 248/346.01 |

FOREIGN PATENT DOCUMENTS

| JP | 11-159443 | 11/1997 |
|---|---|---|
| JP | 63-274942 | * 11/1998 |
| JP | 2005-176412 | 12/2003 |
| JP | 2005-176428 | 12/2003 |

OTHER PUBLICATIONS

"New Polymer-Actuators Using Carbon Nano-Particle Composite (II)", 223$^{rd}$ Annual Conference of the Robotics Society of Japan, Sep. 15-17, 2005, 2 pages in Japanese with English abstract.

* cited by examiner

*Primary Examiner*—Thomas M Dougherty
(74) *Attorney, Agent, or Firm*—Reed Smith LLP; Stanley P. Fisher, Esq.; Juan Carlos A. Marquez, Esq.

(57) ABSTRACT

An object of the present invention is to provide a thin and light-weight actuator module structure comprising a multi-layer structure such as a bimorph or unimorph structure that can be formed in an arbitrary shape and deformed in an arbitrary direction, which is high in safety and durability and can be easily fabricated, as well as a method of manufacturing the same.

An actuator has a structure such that a striped internal stress distribution is induced within a plane of a bending type actuator of a laminate structure, thereby allowing the actuator to bend so as to constitute a part of a cylindrical shape whose central axis is parallel to the striped direction.

16 Claims, 19 Drawing Sheets

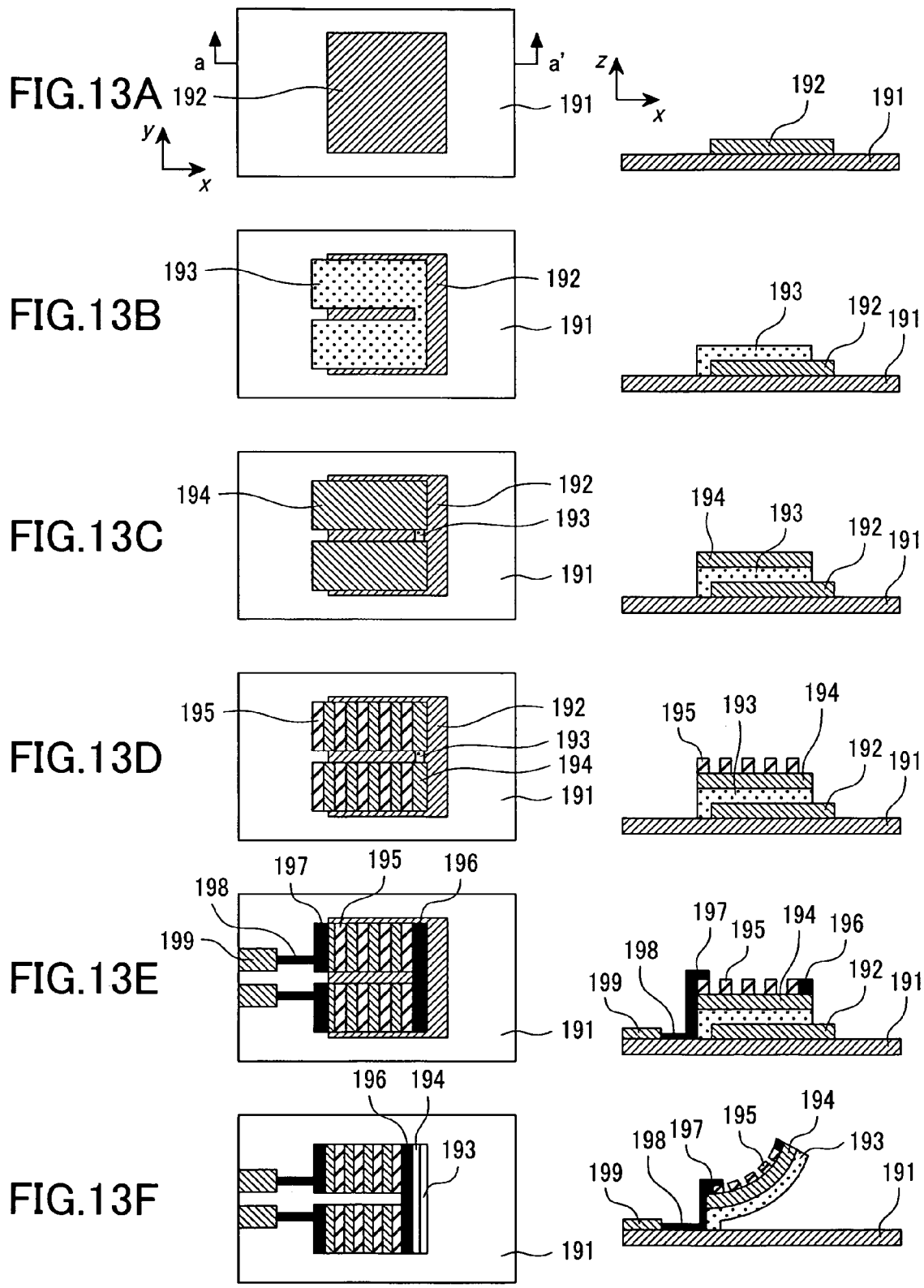

FIG.16A
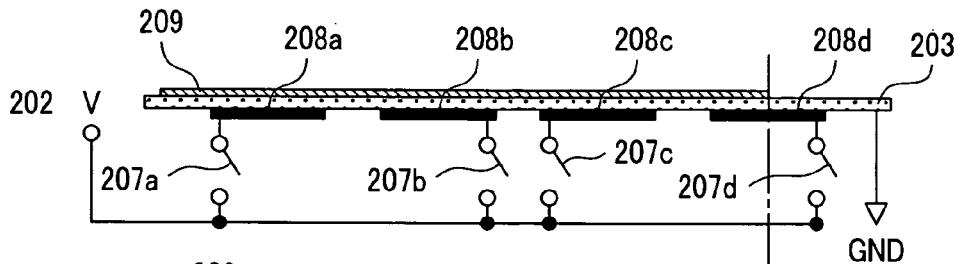
FIG.16B
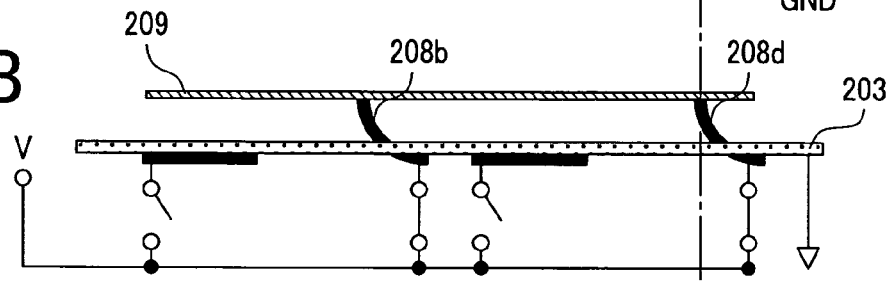
FIG.16C
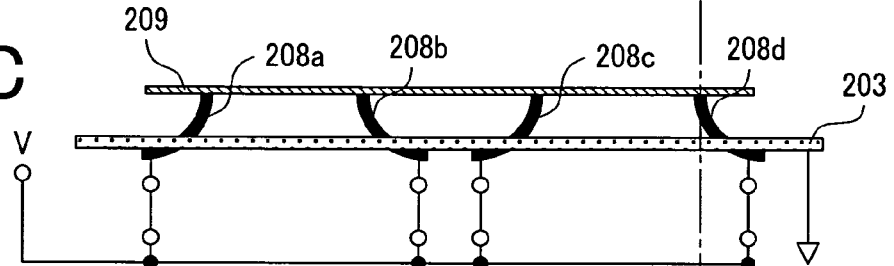
FIG.16D
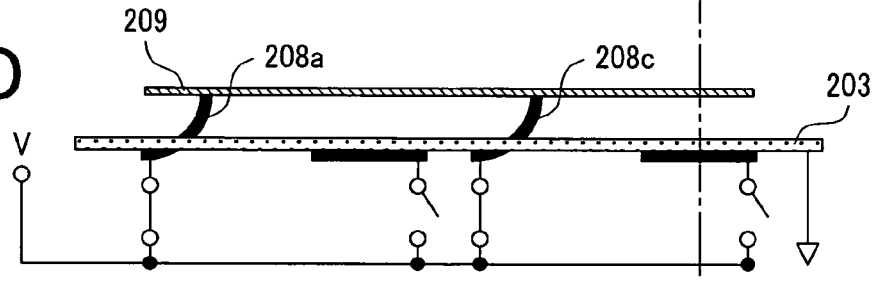
FIG.16E
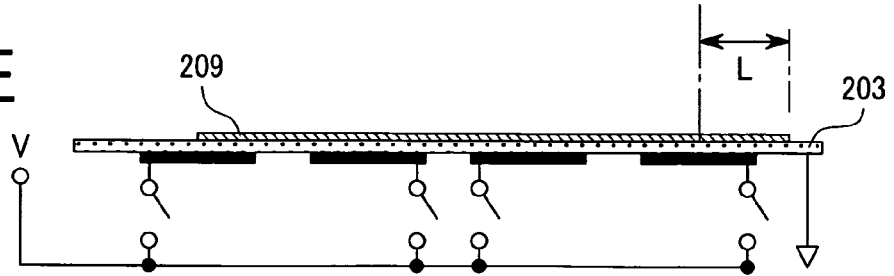
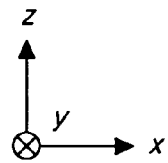

ACTUATOR AND METHOD OF MANUFACTURING ACTUATOR MODULE

CLAIM OF PRIORITY

The present application claims priority from Japanese application JP 2005-345211 filed on Nov. 30, 2005, the content of which is hereby incorporated by reference into this application.

BACKGROUND OF THE INVENTION

1. Field of the Invention

The present invention relates to the structure of a flexible sheet-like bent actuator constituted by a multi-layer structure such as a bimorph or unimorph structure capable of being fabricated easily and permitting complicated and large movements, as well as a method of manufacturing the same.

2. Description of the Related Art

Actuators adapted to generate force and displacement in accordance with an electric signal are presently in use in various industrial fields and the required performances tend to become more and more diversified. For example, actuators used in the fields of precision machines and industrial robots are required to generate a large force and be quick in response and accurately controlled in position. On the other hand, in the case of an active catheter for medical use and rehabilitation equipment, it is required for them to be small-sized, light-weight, soft, low in driving voltage and capable of being handled safely. Further, in the case of a mobile type tactile display or a pin display as a concave/convex display, a thin, light-weight actuator matrix of a large area is needed for operating a pin matrix. Such a thin and light-weight actuator matrix is needed not only for the pin matrix but also in various fields including next generation type free-running small-sized robots and conveying systems utilizing a ciliary movement.

As such a thin and light-weight actuator permitting a matrix configuration, an actuator whose material itself can be deformed repeatedly in accordance with electric signals is more suitable than an actuator which requires assembly of parts such as an electromagnetic motor. As presently well-known examples of the actuator whose material itself is deformed repeatedly, there are mentioned a piezo-actuator which utilizes the piezo effect of ferroelectric and an SMA actuator which utilizes the phase transition of a shape-memory alloy (SMA).

As an actuator which is still lighter and capable of being formed as a thin film, an organic actuator using an organic material adapted to be deformed with an electric signal is now attracting attention of many concerns. Since the organic actuator uses an organic material, not only it is light-weight, but also the material can be easily formed into a sheet shape. Thus, the organic actuator is applicable to a thin and light-weight actuator. However, among such organic actuators, those low in driving voltage and capable of being handled safely have so far operated mainly in only solutions and thus their application fields have been limited.

Recently, however, organic actuators able to operate in gaseous phase, e.g., in the atmosphere, have been reported. Examples of such actuators include an actuator which utilizes deformation at the time of desorption of molecules caused by heat of a conductive polymer (Japanese Patent No. 3131180) and an actuator comprising a carbon nanotube, an involatile ionic liquid and a polymer (Japanese Patent Laid-Open Publication No. 2005-176428).

The present inventors have developed and disclosed an actuator constituted by a composite material comprising conductive particles and a polymer as a new organic actuator which operates in gaseous phase, e.g., in the atmosphere, (Mitori KATO and Masayoshi ISHIBASHI, "New Polymer-Actuators Using Carbon Nano-particle Composite (II)" 23rd Annual Conference of the Robotics Society of Japan, 2005, 1A32). This organic actuator uses an organic composite material which has been made highly electrically conductive by mixing a binder polymer with conductive particles, and voltage is applied to the organic composite material to generate Joule heat, then movement of deformation of the actuator is performed by utilizing a reversible thermal expansion cased by the self-heat generation.

This organic actuator, in comparison with other organic actuators, uses a material less expensive and easy to be improved and can perform a stable operation without influenced by the environment.

In such a thin actuator, like a thin actuator which utilizes the difference in thermal expansion coefficients between metals in order to enlarge the amount of deformation, it is advantageous to laminate materials different in the amount of deformation relative to a temperature and thereby effect a bending motion, like a bimorph structure or a unimorph structure.

The organic actuator described in the foregoing Japanese patent 3131180, which utilizes a thermal expansion and which is constituted by a composite material containing conductive particles, is easy to handle because it is deformed with an electric signal in gaseous phase (atmosphere) and can be formed easily into a sheet shape or the like. Therefore, it is suitable for application to a thin actuator of a laminate structure such as a unimorph structure.

[Patent Literature 1]
Japanese Patent No. 3131180

[Patent Literature 2]
Japanese Patent Laid-Open Publication No. 2005-176428

[Non-Patent Literature 1]
Mitori KATO and Masayoshi ISHIBASHI, "New Polymer-Actuators Using Carbon Nano-particle Composite (II)," 23rd Annual Conference of the Robotics Society of Japan, 2005, 1A32

SUMMARY OF THE INVENTION

In order to use a thin actuator of such a laminate structure effectively, it is necessary for the actuator to have an arbitrary shape and be deformed in an arbitrary direction. For example, reference is here made to an actuator 10 of a unimorph structure including a flexible layer 1 and a base layer 2 laminated together in z direction and having a rectangular shape longer in x direction, as shown in FIG. 1A. In the actuator 10, in order to afford a large displacement in z direction by stretching the flexible layer 1, it is preferable that the actuator be bent so as to constitute part of a cylinder with y axis used as a central axis. However, in the case where the stretching force of the flexible layer 1 is isotropic, the deformation of the actuator 10 depends on the shape of the actuator and the actuator is apt to bend so as to constitute a part of a cylinder centered on a diagonal line of the xy plane of the actuator, as shown in FIG. 1C.

In the organic actuator described in Non-Patent Literature 1, which utilizes a thermal expansion and which is constituted by a composite material containing conductive particles, since the stretching force of the flexible layer 1 is isotropic, if the actuator is fabricated with a laminate structure, its bending direction depends on its shape, as described above in connection with FIG. 1C. Therefore, once the shape is determined, the bending direction is limited. Thus, it has so far been difficult to freely select both shape and bending direction.

As a cantilever actuator of a unimorph structure using the organic actuator described in Non-Patent Literature 1, such an actuator module 100 as shown in FIG. 2A has been proposed. According to the shape of the actuator module 100, a flexible layer 101 and a base layer 102 are superimposed one on the other and are formed in a square U shape, then electrodes 103 and 104 are both provided on open end sides of the square U shape. The flexible layer 101 is formed of a composite material containing conductive particles and a binder polymer. The composite material is deformed upon application of voltage to the electrodes 103 and 104. The base layer 102 is formed of a material which does not deform even upon application of voltage to the electrodes 103 and 104 or deforms in an amount much smaller than the amount of deformation of the flexible layer. When a power supply 106 is connected between the electrodes 103 and 104 of the actuator module 100, the flexible layer 101 stretches and deforms. At this time, the actuator module 100 warps due to a difference in expansion coefficient between the joined flexible layer 101 and base layer 102. In the square U-shaped actuator module, since the connections between the electrodes 103, 104 and the flexible layer 101 are both positioned on the open end sides of the square U shape, the end opposite to the open end sides can be made a free end. Thus, a large bending motion can be ensured without being obstructed by wiring, etc.

However, as noted earlier, since the bending direction depends on the shape, there are the case where the actuator bends so as to constitute a part of a cylinder centered on y axis as in FIG. 2B and the case where the actuator bends so as to constitute a part of a cylinder centered on x axis as in FIG. 2C. In such a bent shape as in FIG. 2C, the free end cannot displace largely. Thus, also in the square U-shaped actuator it is an important subject that the bending direction be selected freely, independently of shape.

In such a bent shape as in FIG. 2B, a simple way to obtain a large displacement is to enlarge the overall length of the actuator module 100. In this case, however, since the electric resistance of the actuator module 100 becomes high, it is necessary to increase the driving voltage. The composite material used as the material of the actuator module 100 is higher in resistivity by about two orders of magnitude in comparison with metal or the like. A high voltage is needed for obtaining a large displacement, thus giving rise to a problem in point of safety.

Further, when voltage is applied to the electrodes attached to the open ends of the square U-shaped actuator module 100, the distribution of an electric current flowing through the flexible layer 101 is not uniform. The electric current, however, flows mainly through the shortest path between the electrodes 103 and 104. That is, the electric current is concentrated on the inner periphery portion of the square U shape and that portion generates heat to excess in comparison with the other portion. Thus, not only a uniform deformation is not attained, but also the excessively heat-generated inner periphery portion is apt to be damaged.

The above-mentioned problems are serious problems not only for the organic actuator described in Non-Patent Literature 1 but also for other organic actuators. In an effort to solve the above problems, for example in Japanese Patent Laid-Open Publication No. 2005-192892, a through slit is formed in an actuator comprising an ion-exchange resin film and thin metallic films formed on both surfaces of the ion-exchange resin film to control a bending direction.

However, this method is limitedly applicable to only a bending type actuator wherein voltage is applied between the thin metallic films to create an electric field within the ion-exchange resin film and this electric field causes ions present within the ion-exchange resin film to move through the film together with water molecules. Thus, the method described in Japanese Patent Laid-Open Publication No. 2005-192892 is not applicable to such a bending type actuator of a laminate structure utilizing a thermal expansion as disclosed in Non-Patent Literature 1.

As to the method of fabrication, a unimorph type actuator using a self-heat generating type organic actuator has heretofore been fabricated by laminating an actuator film and a base insulating film through an adhesive or the like. However, in order to fabricate an actuator module of such a complicated structure as in the present invention, the method of laminating separately-formed actuator film and base insulating film with an adhesive is low in production efficiency. Besides, it is difficult to effect a uniform lamination, and in case of fabricating plural actuator modules of the same shape, it is difficult to make them uniform in performance.

It is an object of the present invention to provide a thin and light-weight actuator module of a multi-layer structure such as a bimorph or unimorph structure capable of being deformed in an arbitrary direction in an arbitrary shape, which is safe, highly durable and can be easily manufactured, as well as a method of manufacturing such an actuator module.

The present invention, in one aspect thereof, proposes a structure of an actuator wherein when a flexible force acts on a thin film of a laminate structure which utilizes a thermal expansion, a stress having a striped distribution is created in a bending direction of the thin film and the thin film bends so as to constitute a part of a cylindrical shape centered on an axis parallel to the stripes, as well as a method of manufacturing such an actuator structure.

The present invention, in another aspect thereof, proposes a structure of an actuator wherein attention is paid to a base layer of a laminate structure and a bending direction of the actuator is controlled by utilizing winding habit of the base layer, as well as a method of manufacturing such an actuator structure.

The present invention, in a further aspect thereof, proposes a structure of an actuator having a wiring layer with conductivity higher than a flexible layer and thereby being made higher in safety and durability, as well as a method of manufacturing such an actuator structure.

According to the present invention it is possible to easily fabricate a thin and light-weight actuator module of a multi-layer structure such as a bimorph or uniformph structure capable of being deformed in an arbitrary direction in an arbitrary shape, which is safe, highly durable and can be easily manufactured.

BRIEF DESCRIPTION OF THE DRAWINGS

FIG. 13A comprises a plan view and a sectional view, showing a printed state of a sacrifice layer pattern printed on a planar substrate sheet, FIG. 13B comprises a plan view and a sectional view, showing a printed state of a base layer pattern printed on the substrate sheet of FIG. 13A, FIG. 13C comprises a plan view and a sectional view, showing a printed state of actuator patterns printed onto the substrate sheet of FIG. 13B, FIG. 13D comprises a plan view and a sectional view, showing a printed state of actuator patterns laminatedly printed onto the substrate sheet of FIG. 13C, FIG. 13E comprises a plan view and a sectional view, showing a printed state of highly conductive layers and wiring patterns printed onto the substrate sheet of FIG. 13D, and FIG. 13F comprises a plan view and a sectional view, showing the state where the sacrifice layer on the substrate sheet of FIG. 13E has been dissolved and removed;

FIG. 16A is a conceptual side view showing the state where an electric current is not supplied to any of the bending type actuator modules on the conveying device sheet shown in FIG. 14, FIG. 16B is a conceptual side view showing the state where a current is supplied to a portion of the bending type modules on the conveying device sheet shown in FIG. 14, FIG. 16C is a conceptual side view showing the state where a current is supplied to all the bending type actuator modules on the conveying device sheet shown in FIG. 14, FIG. 16D is a conceptual side view showing the state where a current is supplied to another portion, different from the portion shown in FIG. 16B, of bending type actuator modules on the conveying device sheet shown in FIG. 14, and FIG. 16E is a conceptual side view showing the state just after turning OFF all the bending type actuator modules on the conveying device sheet shown in FIG. 14;

DESCRIPTION OF THE PREFERRED EMBODIMENTS

Figure 1A:
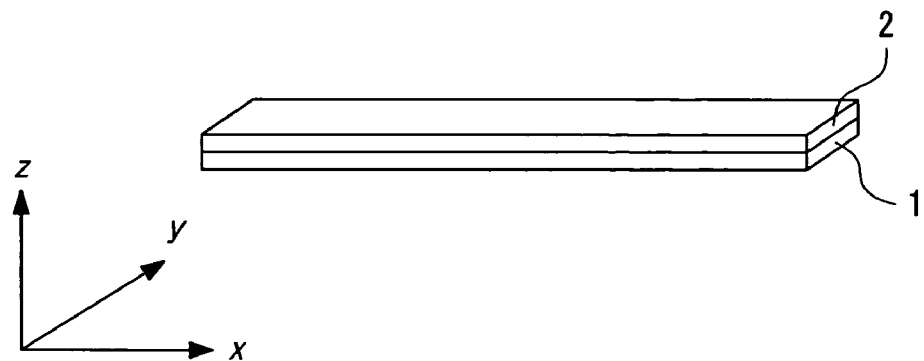
FIG. 1A is a conceptual diagram showing a rectangular actuator of a unimorph structure which is long in x direction.
Figure 1B:
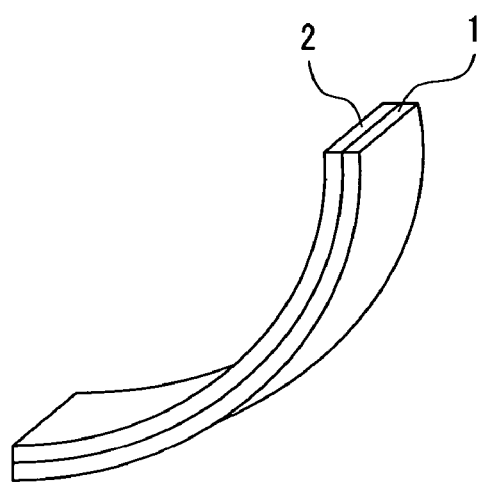
FIG. 1B is a conceptual diagram showing a desirable bent shape of the actuator.
Figure 1C:
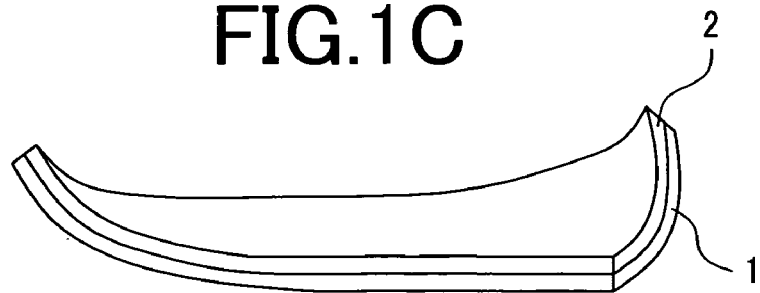
FIG. 1C is a conceptual diagram showing a shape of the actuator that is easy to bend.

The organic actuator described in Non-Patent Literature 1 is a unimorph type thin film actuator constituted by a laminate of both a flexible layer with a uniform quality and a uniform thickness and a base layer with a uniform quality and a uniform thickness, the base layer being formed of an insulating material smaller in thermal expansion coefficient than the flexible layer. When voltage is applied to the flexible layer, the flexible layer expands with heat and an internal stress distribution acting on the thin film of the unimorph type actuator becomes uniform. That is, an isotropic deformation occurs by a thermal expansion. In this case, therefore, the thin film of the unimorph type actuator is deformed so that the flexible layer side becomes convex. However, as described above in connection with FIG. 1C, the direction of deformation of the unimorph type actuator depends on the shape of the actuator.

In order to bend a thin film of a bending type actuator of a laminate structure such as the unimorph structure in a desired direction irrespective of the actuator shape, there may be adopted a structure wherein an anisotropic internal stress distribution occurs in the thin film of the actuator upon expansion of a flexible layer. More particularly, there may be adopted an actuator structure wherein a striped internal stress distribution is produced in the thin film of the actuator upon expansion of the flexible layer of the thin film, the direction of the stripes being parallel to the axis of a cylindrical shape formed by the actuator thin film bent in the desired direction.

If the overall length of the actuator is made large in order to obtain a large displacement, a high voltage is needed for driving the actuator. In addition, an electric current is concentrated on part of the flexible layer due to the actuator shape, resulting in that the part of the flexible layer generates heat to excess. Furthermore, there is a possibility that the thin film of the actuator may be damaged. With respect to the possibility, a highly conductive portion is provided for serving as a wiring layer to supply an electric current to the flexible layer.

Such a complicated structure can be fabricated easily by the multicolor printing technique, i.e., a method of printing several patterns in a superimposed fashion. In such an actuator fabricating method by printing, the composite material containing conductive particles used as a constituent material of the actuator described in Non-Patent Literature 1 is suitable for printing because it can be used as ink. The foregoing Japanese Patent Laid-Open Publication No. 2005-176428 has also disclosed a method of fabricating an actuator portion by application or spraying. The present invention, however, is characterized in that not only the actuator portion but also electrodes and surrounding wiring lines can be fabricated collectively because the multicolor printing technique can be applied to the base layer.

Embodiments of the present invention will be described hereinunder with reference to the accompanying drawings.

First Embodiment

Figure 3A:
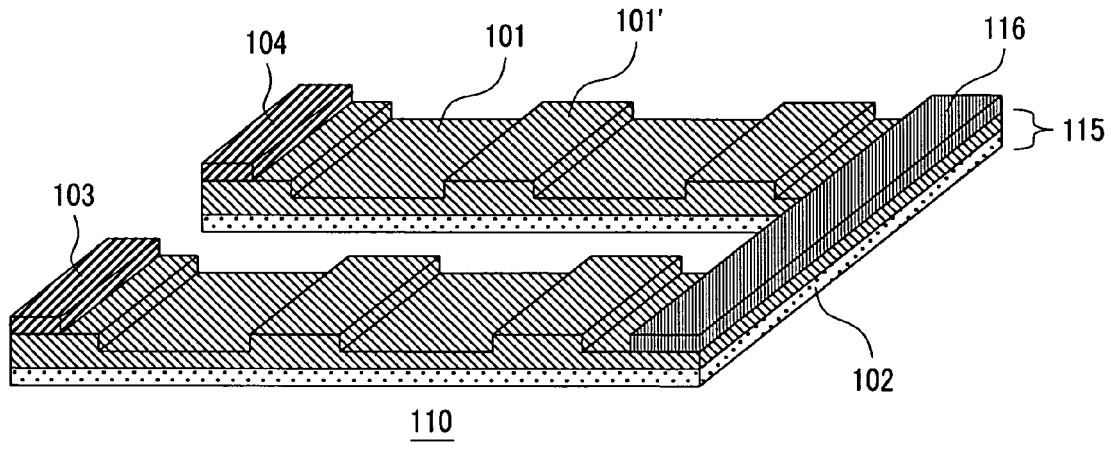
FIG. 3A is a conceptual diagram showing the state before a voltage is applied to an actuator module according to the present invention having concaves and convexes with a film thickness on a flexible layer.
Figure 3B:
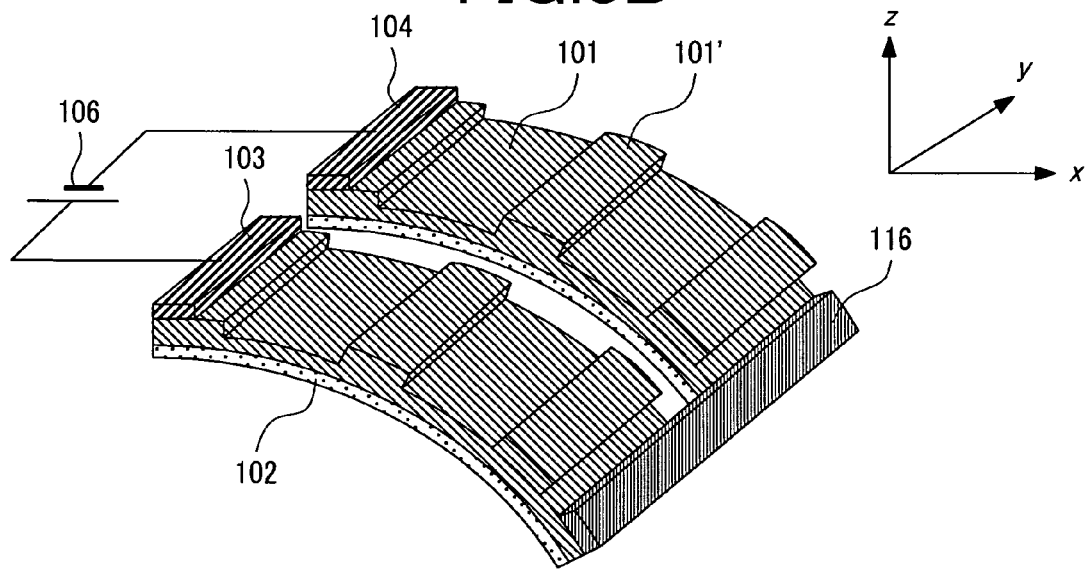
FIG. 3B is a conceptual diagram showing the state where a voltage is applied to the actuator module.
Figure 3C:
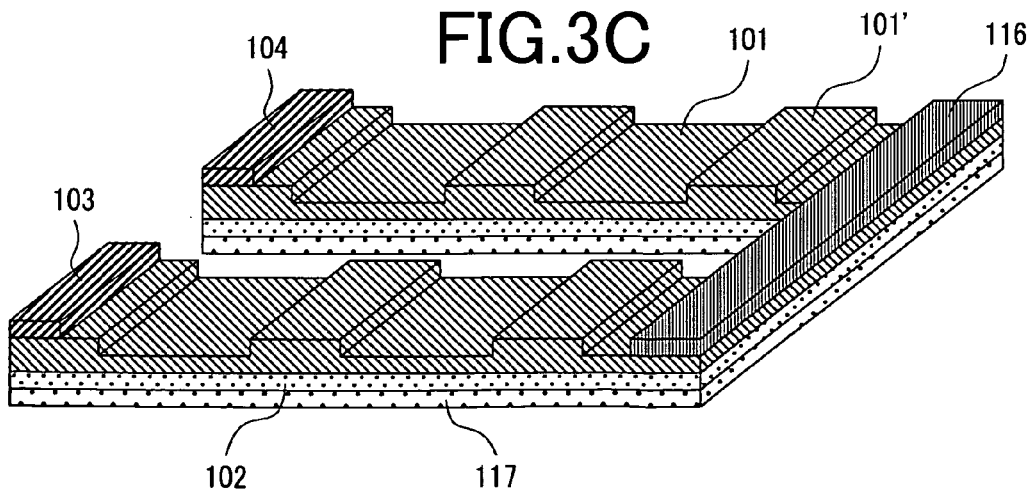
FIG. 3C is a conceptual diagram showing a structure wherein a flexible layer using a material having a negative thermal expansion coefficient is formed on the surface of a base layer of the actuator module opposite to the side of the flexible layer-formed surface.
Figure 4:
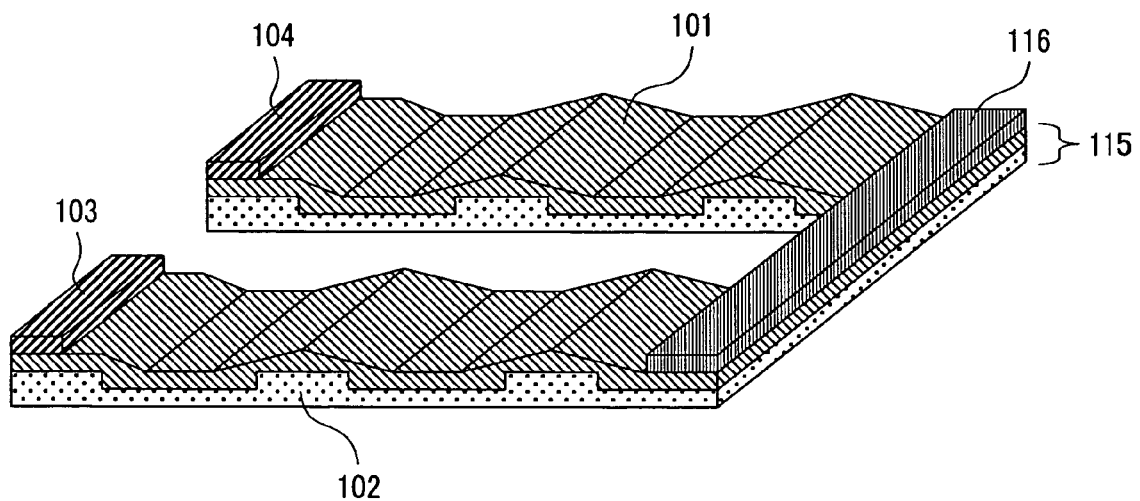
FIG. 4 is a conceptual diagram showing an actuator module according to the present invention having concaves and convexes with a film thickness on a base layer.

With reference to FIGS. 3 and 4, a description will be given below about a unimorph type actuator. The unimorph type actuator has a structure such that concaves and convexes are formed in a striped fashion on a thin film of an actuator module to induce an anisotropic internal stress distribution in the thin film. Thus, the unimorph type actuator bends in an arbitrary direction in an arbitrary shape.

FIGS. 3A to 3C are conceptual diagrams showing the construction of a unimorph type actuator according to a first embodiment of the present invention. FIGS. 3A to 3C shows the outline of an actuator module 110 when viewed obliquely from above. The actuator module 110 has a structure such that a flexible layer 101 is formed with large thickness portions 101' to provide concaves and convexes arranged in a striped fashion in the longitudinal direction of the flexible layer 101. FIG. 3A is a schematic diagram showing the state before a voltage is applied to the actuator module 110 and FIG. 3B is a schematic diagram showing the state of the actuator module 110 upon application of voltage to electrodes 103 and 104. The electrical conductivity of the flexible layer 101 is about 1 S/cm.

Like the actuator module 100, the actuator module 110 is made up of the flexible layer 101 and the electrodes 103 and 104. The flexible layer 101 is formed in a square U shape, a multi-layer film 115 with a base layer 102 joined thereto. Further, in this first embodiment, a highly conductive layer 116 is electrically connected and fixed to the flexible layer 10 on the side where the electrodes 103 and 104 on the flexible layer 101 are not present. The highly conductive layer 116 uses a composite material containing metal particles with an electrical conductivity of about 10000 S/cm.

The actuator module 110 is different from the actuator module 100 in the following points.

(1) The flexible layer 101 has concaves and convexes with a film thickness arranged in a striped fashion.

(2) The highly conductive layer 116 is provided on the side where the electrodes 103 and 104 of the flexible layer 101 are not present.

The concaves and convexes with a film thickness of the flexible layer 101 which are arranged in a striped fashion are formed in parallel to y axis (in the longitudinal direction of the flexible layer 101). With the concaves and convexes in a striped fashion formed in such a direction, when the flexible layer expands and deforms upon application of voltage to the electrodes 103 and 104, an anisotropic internal stress distribution is developed within the plane of the actuator module 110 due to a local difference in moment of inertia of area and the multi-layer film 115 always bends in an convex shape above the central axis of the winding parallel to y axis. In this embodiment, the concaves and convexes in a striped fashion parallel to y axis are formed so that the multilayer film 115 is bent in a convex shape above the central axis of the winding parallel to y axis. However, the multi-layer film 115 can be bent in an arbitrary direction by adjusting the direction of the concaves and convexes in a striped fashion. That is, by forming concaves and convexes in a striped fashion with a film thickness in the flexible layer, it is possible to provide an actuator module which bends in an arbitrary direction.

Figure 2A:
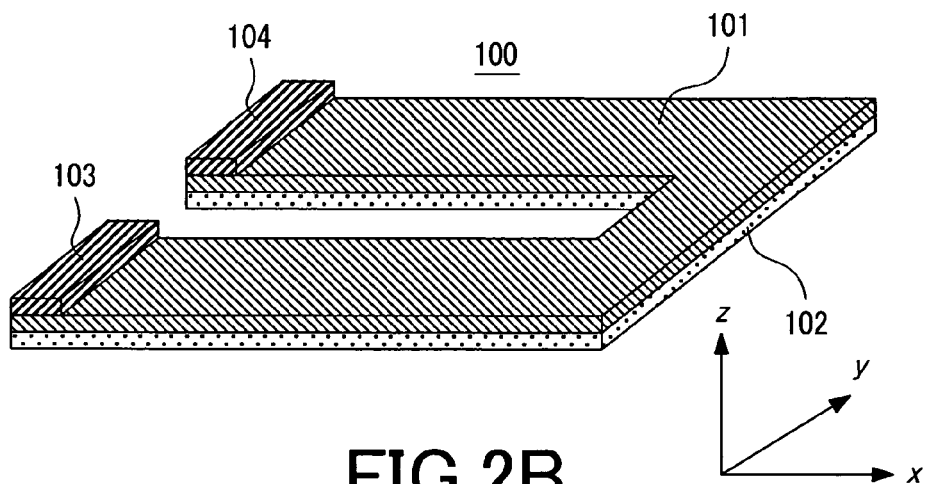
FIG. 2A is a conceptual diagram showing a conventional bending type actuator module.
Figure 2B:
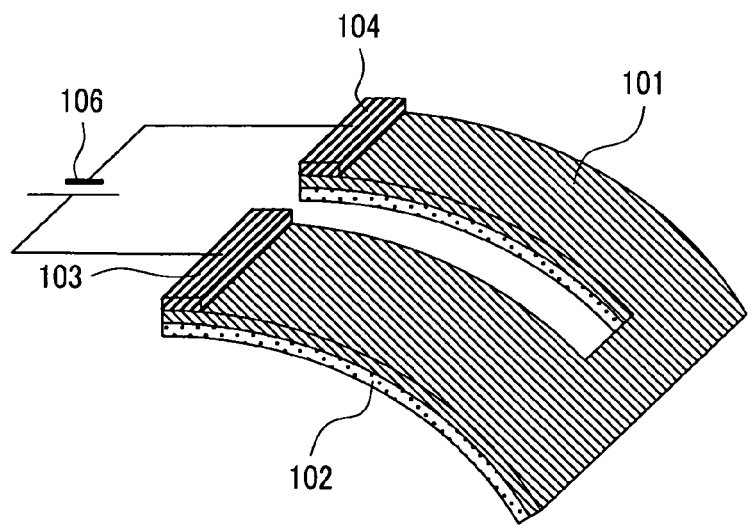
FIG. 2B is a conceptual diagram showing the state where a voltage is applied to the conventional actuator module.
Figure 2C:
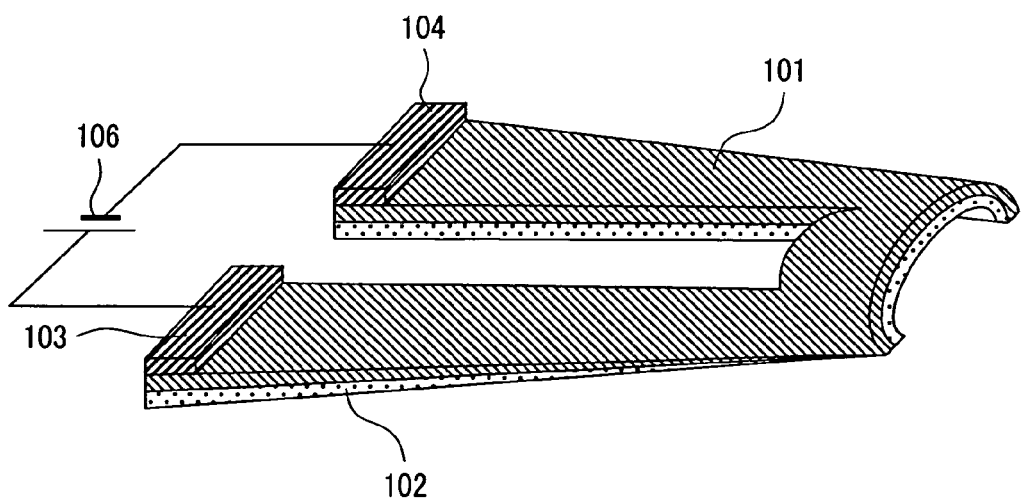
FIG. 2C is a conceptual diagram showing another state where a voltage is applied to the conventional actuator module.

In the square U-shaped actuator module 100 shown in FIG. 2, the flexible layer 101 is bent in a square U shape. In addition, the electric resistance of the flexible layer 101 is not so low as that of metal, so that upon application of voltage between the electrodes 103 and 104 an electric field is concentrated on the inner periphery portion of the square U-shaped flexible layer 101. As a result, the temperature of the inner periphery portion becomes higher than in the other portion due to Joule heat, and the portion is apt to be damaged. On the other hand, in the actuator module 110, the highly conductive layer 116 is provided on the side opposite to the electrodes 103 and 104 so that the free end portion is equal in potential to the electrodes 103, 104. Consequently, in the flexible layer 101, the electric field in the portion between the electrodes 103, 104 and the highly conductive layer 116 becomes uniform. Thus, an electric current flows uniformly through the flexible layer 101, whereby it is possible to prevent damage caused by the concentration of the electric field and hence the durability is improved.

FIG. 3C is a schematic diagram showing a structure wherein a flexible layer 117 is formed of a material having a negative thermal expansion coefficient on the surface of the base layer 102 opposite to the surface on which the flexible layer 101 is formed.

Polyparaphenylenebenzobisoxazole can be used as the material having a negative thermal expansion coefficient. With the opposite flexible layer 117 formed of the material having a negative thermal expansion coefficient, when a voltage is applied to the electrodes 103 and 104, the flexible layer 101 generates heat and expands while the flexible layer 117 contracts, whereby it is possible to obtain a larger bend. Instead of providing the flexible layer 117, the base layer 102 may be used as the material having a negative thermal expansion coefficient. In this case, polyparaphenylenebenzobisoxazole may be used. Such an increase of bend attained by the opposite flexible layer 117 or the base layer 102 having a negative thermal expansion coefficient can also be adopted in other embodiments to be described later.

FIG. 4 is a conceptual diagram showing an outline of an actuator module 120 as seen obliquely from above, the actuator module 120 having a base layer 102 formed with concaves and convexes in a striped fashion. The same concaves and convexes as the concaves and convexes in a striped fashion of the flexible layer 101 shown in FIG. 3 are formed in the base layer 102 to afford the same effect as above.

Figure 5:
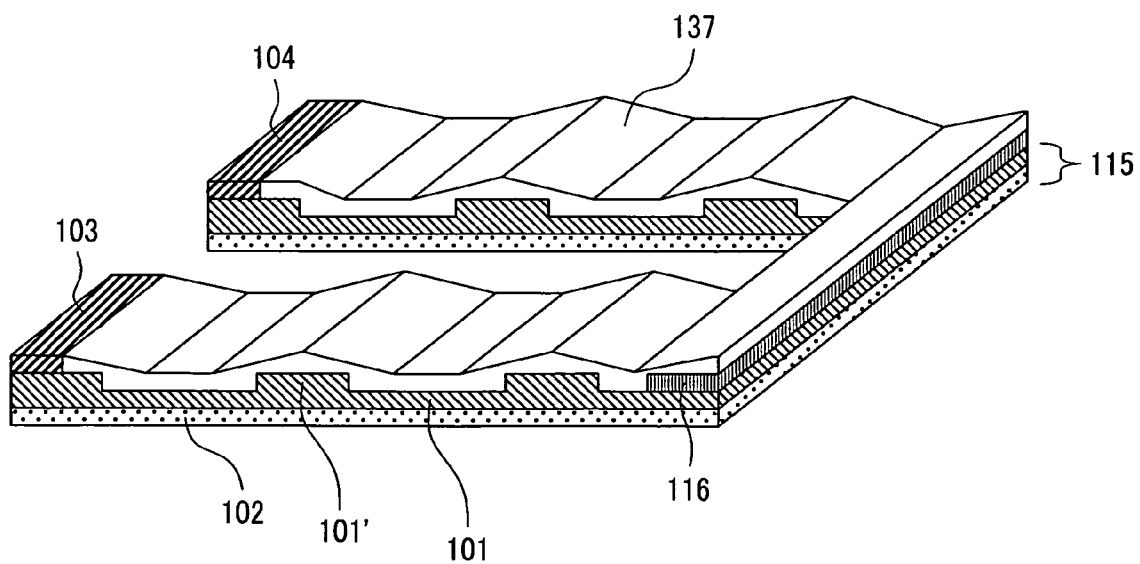
FIG. 5 is a conceptual diagram showing an actuator module of a three-layer structure obtained by coating the flexible layer side of the actuator module of FIG. 3 with resin.

A further layer may be formed on the actuator module as described above. FIG. 5 is a schematic diagram of an actuator module 130 as seen obliquely from above, the actuator module 130 having a three-layer structure wherein the flexible layer 101 side of the unimorph type actuator module described in connection with FIG. 3 is coated with a resin layer 137. The resin layer 137 is stacked on upper surfaces of the multi-layer film 115 and highly conductive layer 116. The resin layer 137 is formed using a flexible and elastic material such as silicone rubber or polyurethane so as not to obstruct bending of the actuator module 130. Thus, by using an insulator as the resin layer 137, there is no danger of electric shock or current leakage even upon contact with the actuator 130. The structure of providing the resin layer 137 of an insulator on the flexible layer 101 side can also be adopted in other embodiments to be described later.

Figure 6A:
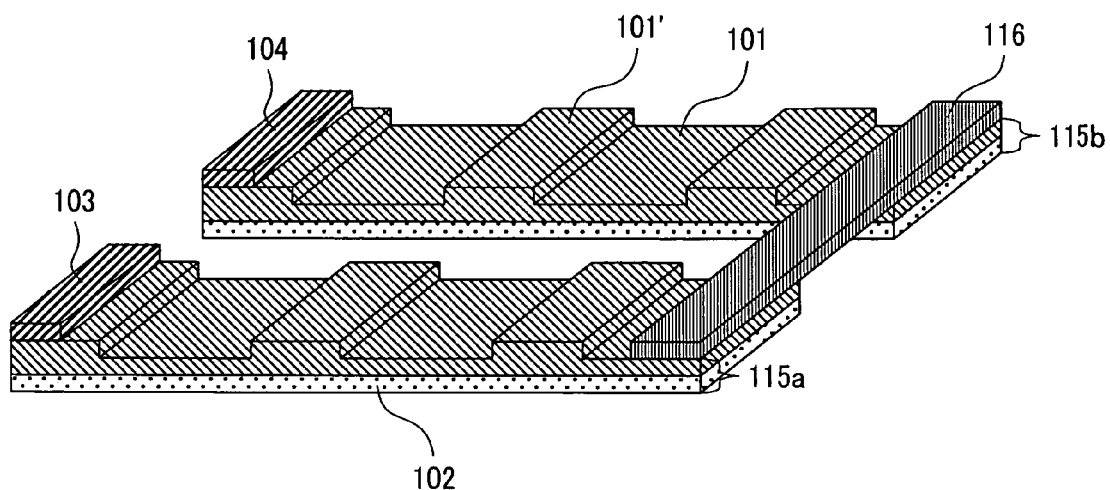
FIG. 6A is a conceptual diagram showing another form of the actuator module of FIG. 3

In these actuator modules, the portion of the multi-layer film 115 overlapped with the highly conductive layer 116 may be cut out as shown in FIG. 6A. FIG. 6A is a schematic diagram of such a form of an actuator module 140 as seen obliquely from above. The actuator module 140 is of almost the same construction as the actuator module 110 of FIG. 3, but uses two multi-layer films 115a and 115b each formed in the shape of a strip instead of the square U-shaped multi-layer film 115. Such a structure permits easy formation of the multi-layer film because it suffices for the multi-layer film to be formed in a simple strip shape, not a square U shape.

Figure 6B:
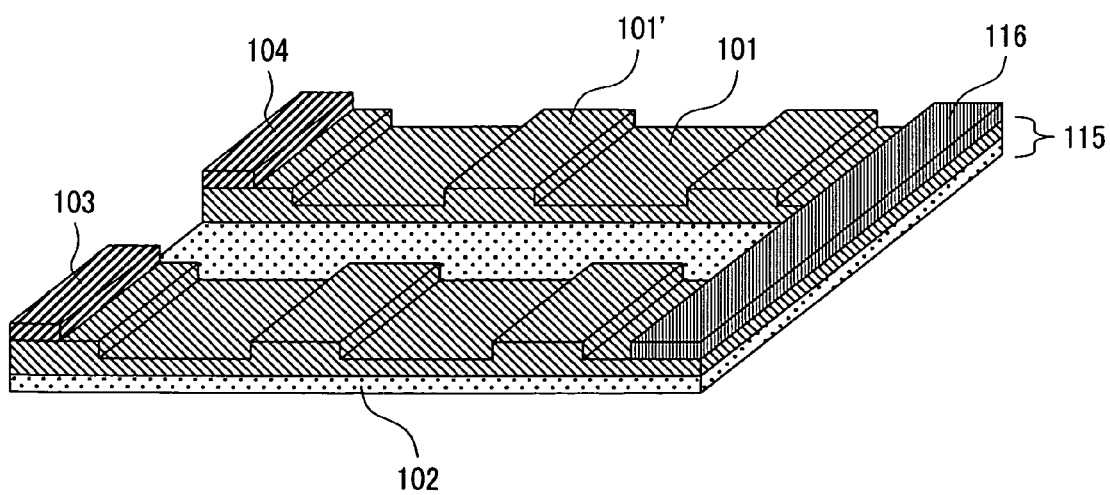
FIG. 6B is a conceptual diagram showing still another form of the actuator module of FIG. 3.

Further, in each of these actuator modules, the base layer 102 may be of a structure having a continuous intermediate portion of a square U shape as shown in FIG. 6B. FIG. 6B is a schematic diagram of such a form of an actuator module 150 as seen obliquely from above. The actuator module 150 is of almost the same construction as the actuator module 110 of FIG. 3. The actuator module 150, however, uses a base layer 102 of a single plate shape having a continuous intermediate portion of a square U shape. Such a structure permits easy handling of the actuator in its assembling process because the rigidity of the actuator module 150 increases.

Second Embodiment

As a second embodiment of the present invention, a description will be given below about a unimorph type actuator having concaves and convexes in a striped fashion with a film thickness and able to afford a large displacement at a low driving voltage.

Figure 7A:
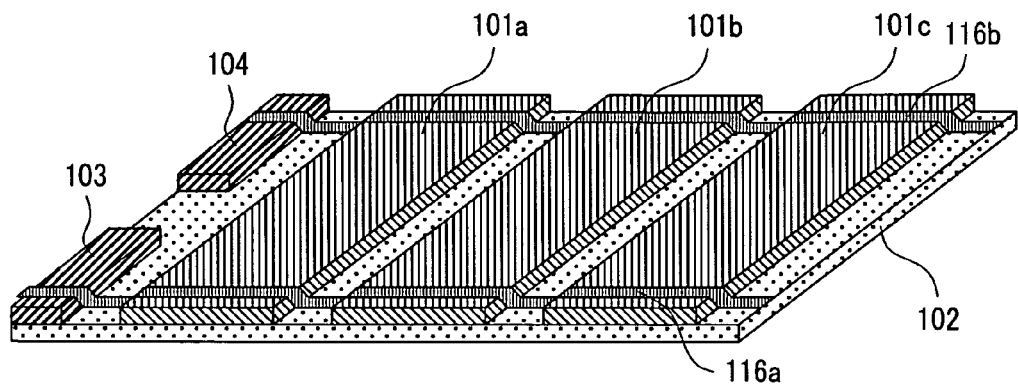
FIG. 7A is a conceptual diagram showing a further actuator module according to the present invention having highly conductive layers at both ends of a flexible layer.
Figure 7B:
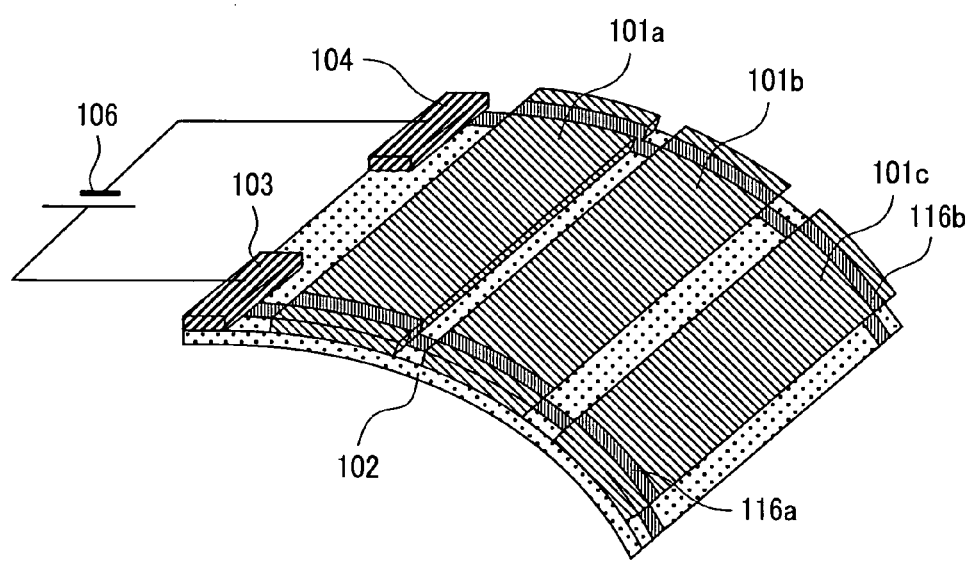
FIG. 7B is a conceptual diagram showing the state where a voltage is applied to the actuator module of FIG. 7A.

FIG. 7 is a conceptual diagram showing an outline of the unimorph type actuator of the second embodiment as seen obliquely from above. FIG. 7A is a schematic diagram showing a state before a voltage is applied to an actuator module 160 and FIG. 7B is a schematic diagram showing a the state where a voltage is applied to the actuator module 160 of FIG. 7A. The actuator module 160 includes a rectangular base layer 102 and rectangular flexible layers 101, 101b, etc. formed thereon in parallel at equal intervals. Highly conductive layers 116a and 116b are disposed so as to overlap both short sides of the flexible layers 101a, 101b, etc. One ends of the highly conductive layers 116a and 116b are connected to electrodes 103 and 104. As in the actuator module 110, the flexible layers 110a and 101b are formed of a conductive particles-containing composite material adapted to deform upon application of voltage thereto. The highly conductive layers 116a and 116b are formed of a metal particles-containing composite material of a high electrical conductivity, and the base layer 102 is formed of a material which does not deform even application of voltage thereto or deforms in an amount much smaller than the amount of deformation of the flexible layers.

When voltage is applied between the electrodes 103 and 104, an electric field is developed between the highly conductive layers 116a and 116b. Thus, an electric current flows in the flexible layers 101a, 101b, . . . and heat is generated by Joule heat. This results in deformation of the flexible layers 110a, 101b, . . . and the overlapped portions of the flexible layers 101 and the base layer 102 warp due to a difference in thermal expansion coefficient between the flexible layers 101 and the base layer 102.

In the case where a material which is deformed by a thermal expansion upon the supply of an electric power is used as the material of each flexible layer, the degree of expansion of the flexible layer depends on the amount of heat generated. The amount of heat generated per unit time in the flexible layer is a value obtained from the electric current supplied multiplied by the voltage applied. In case of adopting such a structure as shown in FIG. 7, the flexible layers 101a, 101b, . . . can be regarded as resistors connected in parallel to a power supply because they are much higher in electric resistance than the highly conductive layers 116a and 116b. Accordingly, the quantity of heat, J, generated per unit time in each flexible layer is $J=V^2/R$, where the voltage applied is V and the resistance of the flexible layer is R.

Therefore, if there are variations in resistance values of the flexible layers 101a, 101b, . . . located between the highly conductive layers 116a and 116b, non-uniformity of deformation occurs such that a certain part of the overlapped portion between the flexible layer and the base layer bends largely and the other portion does not bend so largely. Thus, it is difficult to control the amount of deformation. Therefore, it is preferable that the flexible layers 101a, 101b, . . . be equal in resistance value. That is, it is preferable that the flexible layers 101a, 101b, . . . be equal to one another in both thickness and the length of each short side and also equal in the two distances between the highly conductive layers 116a and 116b.

In this second embodiment, a composite material containing polyester resin and carbon particles is used as the material of the flexible layers 101a, 101b, . . . and a resin layer containing silver particles is used as the material of the highly conductive layers 116a and 116b. A polyimide film having a thickness of 0.025 mm is used as the base layer 102. Three flexible layers 101a, 101b and 101c each having a thickness of 0.03 mm, a width of 7 mm and a length of 3.5 mm are arranged on the base layer 102 at intervals of 1.5 mm in the longitudinal direction. When the voltage of 7 volts is applied between the electrodes 103 and 104 of the actuator module 160, the film tip warps about 6 mm downward. This voltage is lower than the voltage which is applied to the square U-shaped bending type actuator of the first embodiment to attain the same degree of displacement. In the bending type actuator module provided with the highly conductive layers 116a and 116b at both ends of the flexible layers 101a, 101b and 101c, it is possible to keep the driving voltage low. To attain a large displacement, it is necessary to lengthen the actuator module. In the case of a square U-shaped bending type actuator, however, resistance increases in proportion to the length, thus resulting in an increase of the driving voltage. In the actuator module of such a shape as shown in FIG. 7 wherein highly conductive layers are provided at both ends of the flexible layers, the driving voltage becomes lower as the actuator module is made longer in order to attain a large displacement.

Figure 7C:
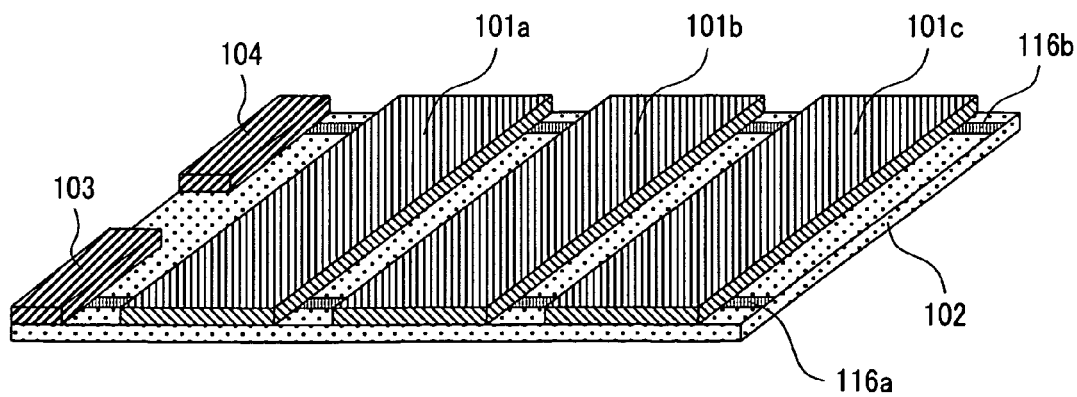
FIG. 7C is a conceptual diagram showing a still further actuator module according to the present invention having highly conductive layers provided at both ends of a flexible layer and on the side of the base layer.

FIG. 7C is a schematic diagram showing a state before a voltage is applied to the actuator module 160. As is seen from a comparison with FIG. 7A, the highly conductive layers 116a and 116b are provided between the electrodes 103, 104, as well as the flexible layers 101a, 101b, 101c, and the base layer 102. As noted earlier, the base layer 102 and the flexible layers 101a, 101b, 101c are very thin. However, it is not preferable that the highly conductive layers 116a and 116b are formed at portions having a difference in height. In view of this point, the highly conductive layers 116a and 116b are formed first on the base layer 102 and thereafter the flexible layers 101a, 101b, 101c are formed.

Figure 8:
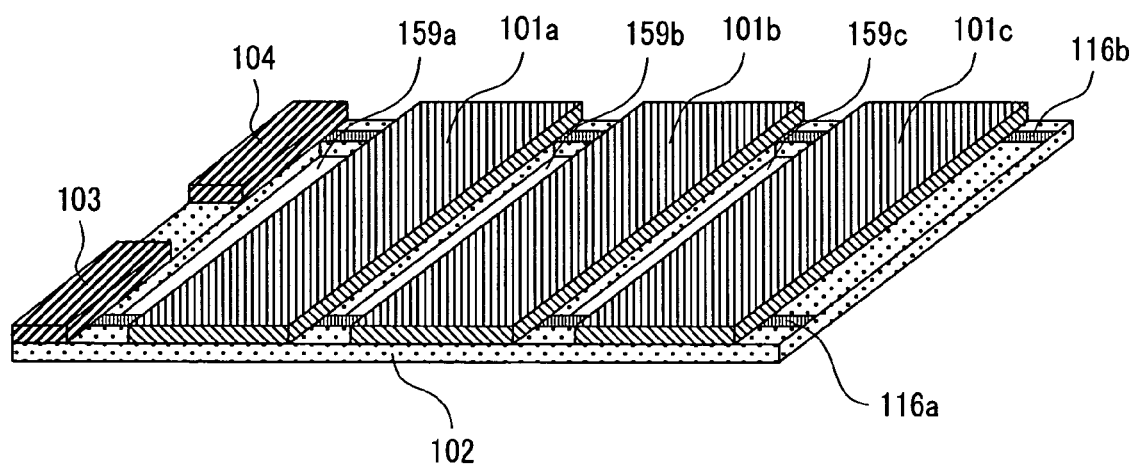
FIG. 8 is a conceptual diagram showing a still further actuator module according to the present invention having apertures in part of the actuator module of FIG. 7.

As shown in FIG. 8, in the actuator module of the second embodiment shown in FIG. 7, apertures 159a, 159b, . . . may be formed in the portions of the base layer 102 on which the flexible layers 101a, 101b, 101c and the highly conductive layers 116a, 116b are not overlapped, thereby permitting the actuator module to bend more easily.

Third Embodiment

In the above first and second embodiments, the actuators are in a flat state when no voltage is applied to the electrodes 103 and 104, and an anisotropic internal stress distribution is developed upon application of voltage to the electrodes and the bending occurs. In this third embodiment, a description will be given about a unimorph type actuator using a base layer 102 having an intrinsic anisotropic internal stress distribution. What the base layer 102 has an intrinsic anisotropic internal stress distribution means that the base layer is not originally a flat film, but its original film shape is a convex shape above or under the central axis of the winding parallel to y axis due to winding habit, etc. If the unimorph type actuator of the first or the second embodiment is fabricated using such a base layer, this results a unimorph type actuator having a bend according to the anisotropic internal stress distribution specific to the base layer 102 even if a voltage is not applied. For the actuator module in this case, irrespective of the actuator shape, an anisotropic internal stress distribution occurs in the direction of the winding habit due to elongation of each flexible layer caused by the application of voltage and a certain bending deformation occurs in the direction of the winding habit.

In this case, when the elongation of the flexible layer caused by the application of voltage acts in a direction to offset the anisotropic internal stress distribution of the base layer, deformation occurs so that the bending of the actuator module becomes small. On the other hand, when the elongation of the flexible layer caused by the application of voltage acts in a direction in which the elongation is added to the anisotropic internal stress distribution of the base layer, deformation occurs so that the bending of the actuator module becomes large.

Fourth Embodiment

In the fourth embodiment, a description will be given about a method of fabricating an actuator module using an actuator according to the present invention by printing without adopting a laminating process using an adhesive which poses a problem in device fabrication. The actuator module fabricating method of the fourth embodiment adopts a screen printing method using a 180-mesh screen. According to the fourth embodiment, even an actuator module of a complicated structure can be fabricated in high production efficient and with little variations in performance between actuator modules.

First, a method of fabricating a unimorph type actuator module using a base insulating film having a winding habit as an anisotropic internal stress distribution will be described with reference to FIGS. 9A to 9D.

FIGS. 9A to 9D are conceptual diagrams showing fabrication steps for an actuator matrix module sheet comprising three actuator units of different shapes. In each of FIGS. 9A to 9D, a plan view (xy plane) is shown on the left side and a sectional view (xz plane) is shown on the right side.

Figure 9A:
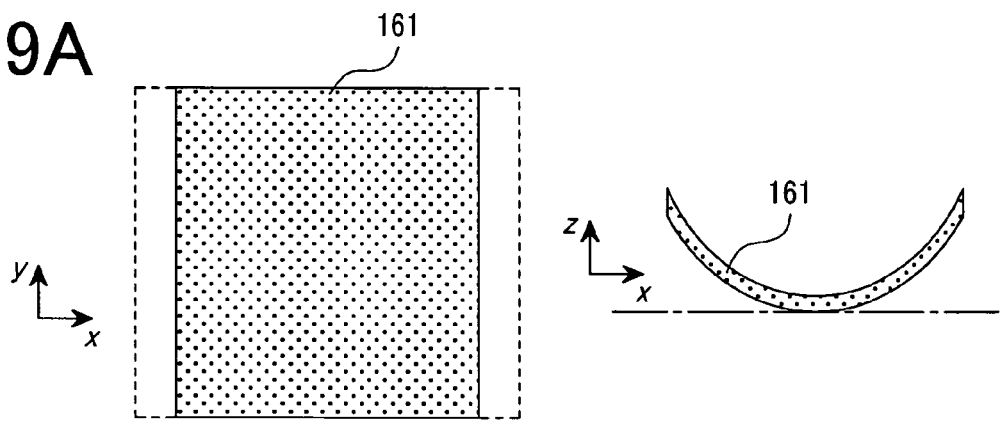
FIG. 9A comprises a plan view and a sectional view, showing a substrate sheet having winding habit, FIG. 9B comprises a plan view and a sectional view, showing a printed state of actuator patterns printed onto the substrate sheet of FIG. 9A, FIG. 9C comprises a plan view and a sectional view, showing a printed state of highly conductive layers and wiring patterns printed onto the substrate sheet of FIG. 9B, and FIG. 9D comprises a plan view and a sectional view, showing the state where the substrate sheet of FIG. 9C is cut along the actuator patterns thereon.

FIG. 9A comprises a plan view and a sectional view both showing a substrate sheet 161 having a winding habit (a convex shape under the central axis of the winding parallel to y axis) of such a magnitude as is indicated by broken lines when developed in plan.

Figure 9B:
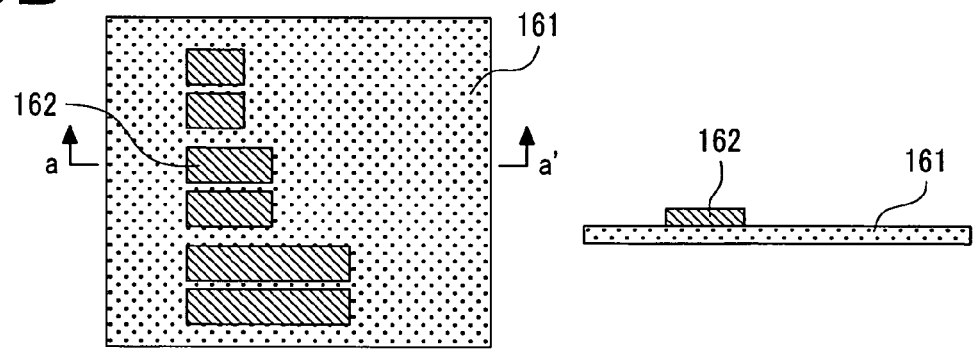

FIG. 9B shows the state where four corners of the base sheet 161 are held down and fixed into a plane and actuator patterns (flexible layers) 162 are printed onto the thus-fixed substrate sheet 161 with use of actuator ink. In its sectional view, the base sheet 161 is viewed in the direction of arrows at a-a' position in the plan view. A polyimide film having a thickness of 0.025 mm is used for the base sheet 161. The actuator ink comprises an epoxy resin prepolymer and an epoxy curing agent with carbon particles incorporated in each of them. Both are mixed together just before printing. After printing, the actuator ink cures and becomes a composite material with an electrical conductivity of about 1 S/cm wherein conductive particles are the carbon particles and a binder polymer is the epoxy resin. Since this actuator ink is a two-liquid mixed curing type, it is possible to ignore shrinkage after curing. The solution viscosity in the actuator ink is adjusted so as to give a film thickness of each actuator pattern 162 of about 0.03 mm after printing and curing.

The actuator patterns 162 comprise three unit patterns arranged in parallel. The three unit patterns consist of two rectangular patterns each 4.5 mm by 5 mm arranged at an interval of 1 mm in y axis direction, two rectangular patterns each 4.5 mm by 10 mm arranged at an interval of 1 mm in y axis direction, and two rectangular patterns each 4.5 mm by 20 mm arranged at an interval of 1 mm in y axis direction.

Figure 9C:
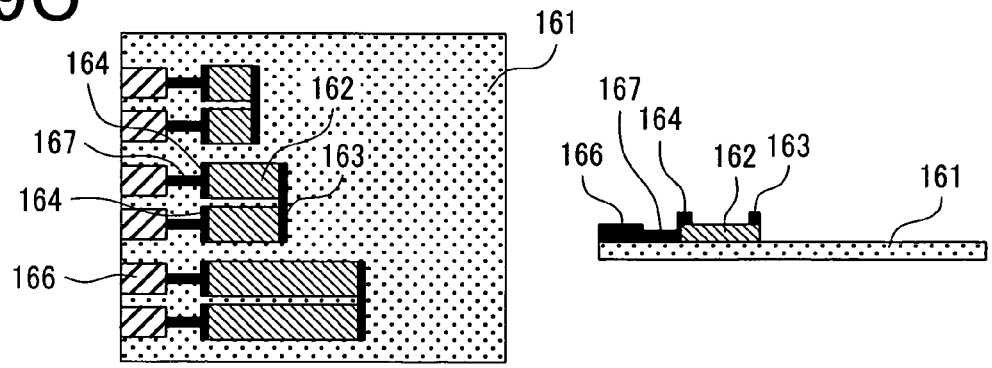

FIG. 9C shows the state where highly conductive layers 163, electrodes 164, connecting terminals 166 and wiring patterns 167 disposed between the electrodes 164 and the connecting terminals 166 are printed collectively using a highly conductive ink after curing of the actuator patterns 162. The sectional position thereof is the same as FIG. 9B. As the highly conductive ink, conductive ink, which contains silver particles used as filler and with which the electrical conductivity of the pattern becomes about 20000 S/cm after drying. As to the highly conductive ink, the solution viscosity is adjusted so that the highly conductive layers 163 and the wiring patterns 164 are each about 0.03 mm in thickness after printing, drying and curing.

The highly conductive patterns 163 are each a rectangular pattern of 10 mm by 1 mm and disposed in such a manner that two rectangular patterns which constitute each unit pattern of the actuator patterns 162 are connected at one ends thereof. In each unit pattern of the actuator patterns 162, the wiring patterns 167 provide connections between the electrodes 164 printed on the side where the highly conductive layer 163 is not connected and the connecting terminals 166.

Figure 9D:
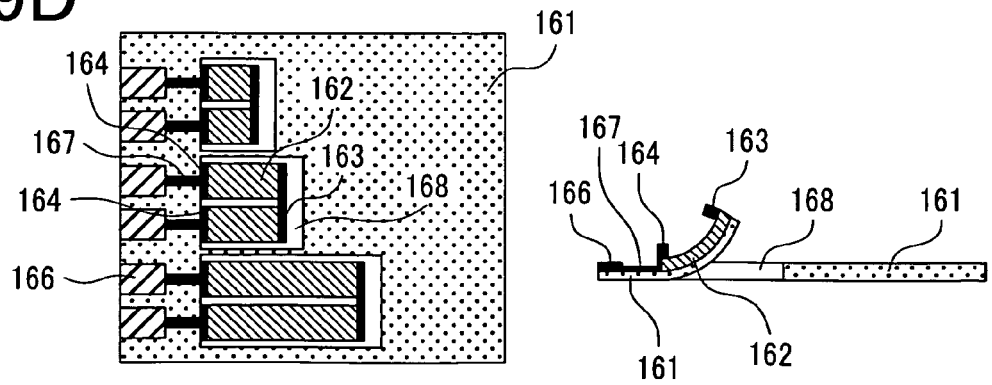

FIG. 9D shows the state where after drying and curing of the printed highly conductive layers 163, electrodes 164, connecting terminals 166 and wiring patterns 167 between the electrodes 164 and the connecting terminals 166, the base sheet 161 is cut around the actuator patterns 162 along square U-shaped cutting portions 168 into a cantilever of the unimorph structure comprising the base layer 102 and the flexible layer 101 described in the first embodiment. A sectional position thereof is the same as FIG. 9B. In the fourth embodiment since the base sheet 161 having a winding habit (a convex shape under the central axis of the winding parallel to y axis) is used, when the base sheet 161 is cut in a square U shape around the actuator patterns 162, a unimorph type actuator module having a bend conforming to the winding habit can be obtained.

Although in the fourth embodiment, the actuators, wiring patterns and highly conductive layers are printed in this order, printing may be performed in the order of wiring patterns, highly conductive layers, and actuators. Moreover, although a cutting machine is used in the embodiment, cutting them collectively may be done by punching.

In this way, an actuator matrix module sheet 169 comprising unimorph type actuator units each using a self-heat generation type organic actuator can be fabricated efficiently without using the laminating process.

When a predetermined voltage is applied to the connecting terminals 166 so that an electric current flows in the actuator units in the actuator matrix module sheet 169, the three actuator units of different shapes bent in one direction are deformed in a direction so as to be plane. That is, the actuator units can bend in one direction no matter what actuator shape may be.

Although the base sheet 161 having winding habit to have a convex shape under the central axis of the winding parallel to y axis is used in this embodiment, if it is substituted by a base sheet having winding habit to have a convex shape above the central axis of the winding, an actuator unit having a convex shape above the central axis of the winding parallel to y axis. The actuator unit, when voltage is applied thereto, is deformed so that its bend becomes larger.

Fifth Embodiment

Next, a method of fabricating a unimorph type actuator module having a striped thickness distribution on a base insulating film will be described with reference to FIG. 10.

FIGS. 10A to 10D are conceptual diagrams showing fabrication steps for an actuator matrix module sheet comprising four actuator units different in direction. In each of FIGS. 10A to 10D, the left side is a plan view (xy plane) and the right side is a sectional view (xz plane).

Figure 10A:
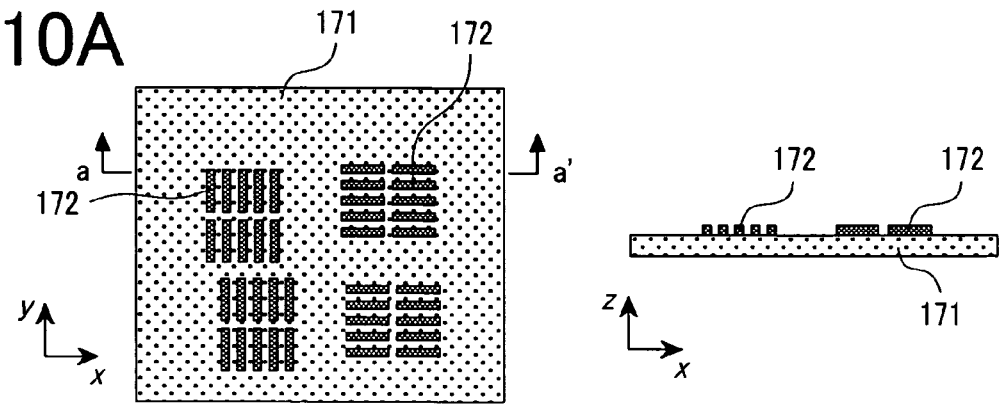
FIG. 10A comprises a plan view and a sectional view, showing a printed state of base layer patterns printed onto a planar substrate sheet, FIG. 10B comprises a plan view and a sectional view, showing a printed state of actuator patterns printed onto the substrate sheet, FIG. 10C comprises a plan view and a sectional view, showing a printed state of highly conductive layers and wiring patterns printed onto the substrate sheet, and FIG. 10D comprises a plan view and a sectional view, showing the state where the substrate sheet of FIG. 10C is cut along the actuator patterns thereon.

FIG. 10A shows the state where base layer patterns 172 are printed using an insulator ink on a planar base sheet 171. In its sectional view, the base sheet 171 with the base layer patterns 172 printed thereon is seen in the direction of arrows at a-a' position in the plan view. In the present embodiment, the base sheet 171 uses a polyimide film having a thickness of 0.025 mm. As the insulator ink there is used a polyimide solution which is used for a polyimide resist in the semiconductor process. The viscosity of the polyimide solution is adjusted before use so as to give a film thickness of about 0.03 mm after screen printing and subsequent drying and curing. In the base layer patterns 172, one unit pattern is made up of 2 rows by 5 columns of rectangular patterns each 4.5 mm by 1 mm arranged at intervals of 1 mm. The two unit patterns are arranged in two rows in the first column, and the unit patterns that are turned 90° relative to the first column unit patterns are arranged in two rows in the second column. That is, the total of four unit patterns are arranged in two rows by two columns.

Figure 10B:
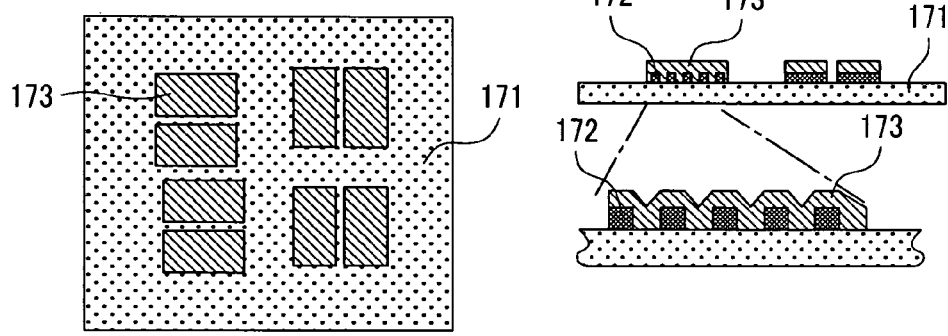

FIG. 10B shows the state where actuator patterns are printed using actuator ink after drying and curing of the base layer patterns 172. A sectional position thereof is the same as in FIG. 10A. In its sectional view, the upper sectional view is a sectional view of the entire base sheet and the lower one is an enlarged sectional view of a portion extracted along dash-dot lines. The actuator ink is the same as that described in the actuator module fabricating method in connection with FIG. 9. As to the actuator patterns 173, one unit pattern is made up of two rectangular patterns of 4.5 mm by 10 mm arranged vertically in parallel at an interval of 1 mm. The actuator patterns 173 are formed so as to cover the base layer patterns 172.

Figure 10C:
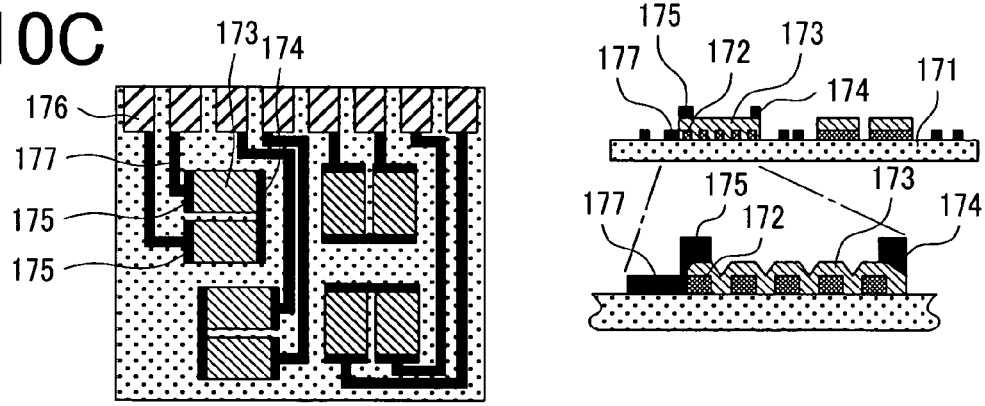

FIG. 10C shows the state where highly conductive layers 174, electrodes 175, connecting terminals 176 and wiring patterns 177 are printed collectively using a highly conductive ink after curing of the actuator patterns 173. A sectional position thereof is the same as FIG. 10A. Its sectional view comprises an entire sectional view and an enlarged sectional view like FIG. 10B. The highly conductive ink is the same as that described in the actuator module fabrication method in connection with FIG. 9.

The highly conductive layers 174 are each disposed so that two rectangular patterns which constitute each unit pattern of the actuator patterns 173 are connected at one ends thereof. In each unit pattern of the actuator patterns 173, the wiring patterns 177 provide connections between the electrodes 175 printed on the side where the highly conductive layer 174 is not connected and the connecting terminals 176.

Figure 10D:
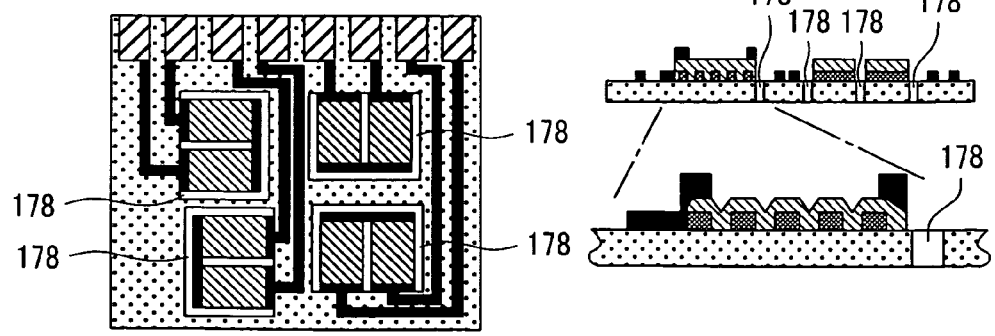

FIG. 10D shows the state where an actuator matrix module sheet 179 is completed with actuator units arranged in two rows by two columns. In this figure, the base sheet 171 is cut around the actuator patterns 173 along square U-shaped cutting portions 178 so as to provide a cantilever of a unimorph structure of two rows by two columns using the base sheet 171 as a base layer and the actuator patterns 173 as flexible layers. A sectional position thereof is the same as FIG. 10A. Its sectional view comprises an entire sectional view and an enlarged sectional view like FIG. 10B. The square U-shaped cutting positions around the actuator patterns are indicated by 178. The cutting operation is performed in such a manner that the unit pattern positioned in the first row and first column is in a square U shape, the unit pattern positioned in the second row and first column is in a form resulting from 180° rotation of the U shape, the unit pattern in the first row and second column is in a form resulting from 90° rotation of the U shape, and the unit pattern in the second row and second column is in a form resulting from 700° rotation of the U shape. Although a cutting machine is used the fifth embodiment, the cutting portions may be cut collectively by punching.

When voltage is applied from the connecting terminals 176 so that an electric current flows in the each actuator unit, the first column of actuator units are deformed in a convex shape above the central axis of the winding parallel to y axis and the second column of actuator units are deformed in a convex shape under the central axis of the winding parallel to x axis, then revert to their original shapes upon turning OFF of the supply of voltage. That is, by adopting the actuator unit structure of the first embodiment described above in connection with FIG. 4, actuator modules adapted to bend in various directions can be fabricated collectively.

In the fifth embodiment, the base sheet 171 is a planar sheet, and an epoxy resin prepolymer and an epoxy curing agent, whose shrinkage after curing is ignorable, are used as the actuator ink. Thus, when the patterns are cut in a cantilever shape, each actuator unit in a cantilever shape does not bend and remains planar, as shown in FIG. 9D.

The actuator matrix module sheet 179 of the fifth embodiment is deformed so that a center angle becomes 70° under a driving voltage of 30 volts.

In the fifth embodiment, in order to impart a striped thickness distribution to the base insulating film, the base layer patterns 172 are formed of the same material as that of the base sheet 171. However, the base layer patterns 172 may be formed of another material. For example, if the base layer patterns are formed using a highly conductive ink, the electrical resistance becomes lower as a whole and it is possible to keep the applied voltage low. In this case, if printing is performed in the order of base layer patterns and highly conductive layers, then actuator patterns instead of printing in the order of base layer patterns, actuator patterns and highly conductive patterns, a single type of materials and a single step of the steps can be eliminated. Also, in the fifth embodiment, if the actuator ink contains a solvent to decrease the concentration so that the shrinkage after curing becomes large, the actuator unit bend in a downwardly convex shape when patterns are cut in a cantilever shape. When voltage is applied to each actuator unit bent in a downwardly convex shape, the actuator unit is deformed in a planer direction.

Figure 11:
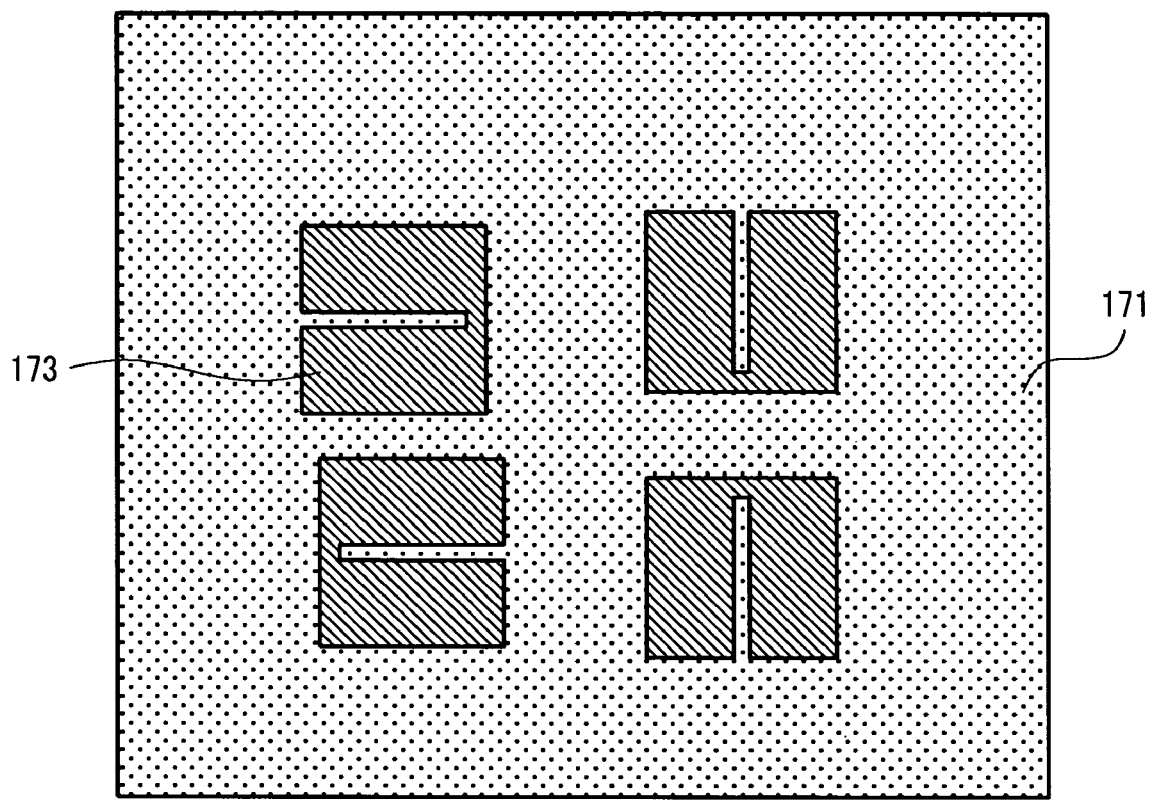
FIG. 11 is a plan view showing an example in which square U-shaped actuator patterns are arranged in different directions.

According to the structure shown in FIG. 10, the actuator patterns 173 which constitute each unit pattern comprise two rectangular patterns arranged in parallel as in FIG. 6A, but such a square U-shaped pattern as shown in FIG. 11 may be adopted like that described above in connection with FIG. 3. Even in this case, operation can be ensured without posing any problem.

Sixth Embodiment

Now, with reference to FIG. 12, the following description is provided about a method of fabricating an actuator matrix module sheet having a striped thickness distribution in flexible layers.

FIGS. 12A to 12D are conceptual diagrams showing fabrication steps for an actuator matrix module sheet comprising two rows by two columns of the actuator units described in connection with FIG. 3 in the first embodiment and arranged on a single sheet. In each of FIGS. 12A to 12D, the left side is a plan view (xy plane) and the right side is a sectional view (xz plane).

Figure 12A:
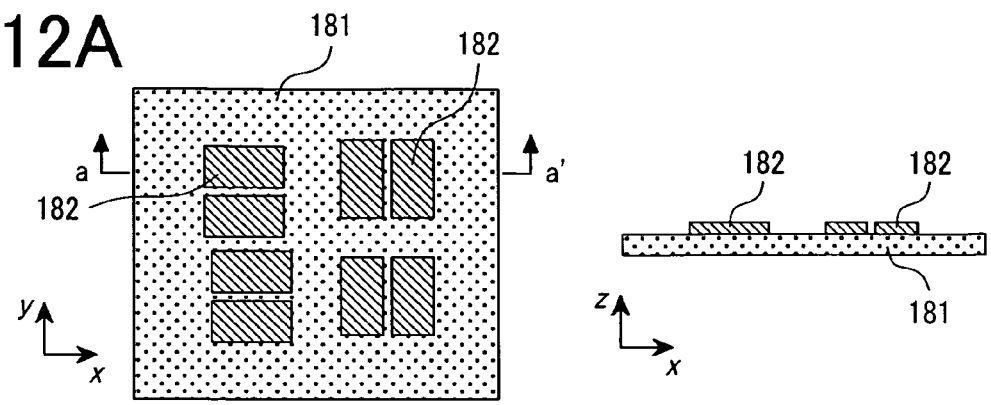
FIG. 12A comprises a plan view and a sectional view, showing a printed state of actuator patterns printed onto a planar substrate sheet, FIG. 12B comprises a plan view and a sectional view, showing a printed state of actuator patterns laminatedly printed onto the substrate sheet of FIG. 12A, FIG. 12C comprises a plan view and a sectional view, showing a printed state of highly conductive layers and wiring patterns printed onto the substrate sheet of FIG. 12B, and FIG. 12D comprises a plan view and a sectional view, showing the state where the substrate sheet of FIG. 12C is cut along the actuator patterns thereon.

FIG. 12A shows the state where actuator patterns 182 are printed on a base sheet 181 using actuator ink. In its sectional view, the base sheet 181 with the actuator patterns 182 printed thereon is seen in the direction of arrows at a-a' position in the plane view. A polyimide film having a thickness of 0.025 mm is used as the base sheet 181. As the actuator ink, the same actuator ink as that used in the actuator module fabrication method described above in connection with FIG. 9 is used.

Two rectangular actuator patterns 182 each 4.5 mm by 10 mm are arranged vertically in parallel in the figure at an interval of 1 mm to constitute one unit pattern. Two rows of such unit patterns are arranged in the first column and patterns resulting from 90° rotation of the unit patterns are arranged in two rows in the second column. That is, the total of four unit patterns are arranged in two rows and two columns.

Figure 12B:
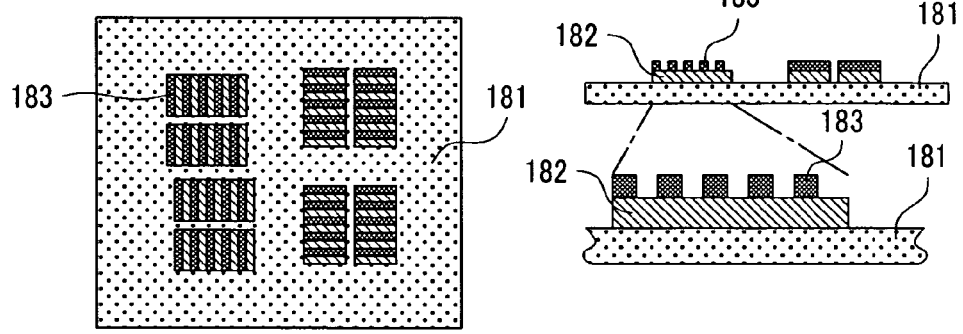

FIG. 12B shows the state where, after curing of the actuator patterns 182, actuator patterns 183 are printed so that they overlap with the actuator patterns 182 using the actuator ink. A sectional position thereof is the same FIG. 12A. In its sectional view, the upper side is an entire sectional view, while the lower side is an enlarged sectional view of an extracted portion indicated by dot-dash lines. As to the actuator patterns 183, rectangular patterns each 4.5 mm by 1 mm are arranged two rows by five columns at an intervals of 1 mm in longitudinal and transverse directions to constitute one unit pattern. Two rows of the unit patterns are arranged in the first column and two rows of patterns resulting from 90° rotation of the unit patterns are arranged in the second column. That is, the total of four unit patterns are arranged two rows by two columns so as to overlap with the actuator patterns 182.

Figure 12C:
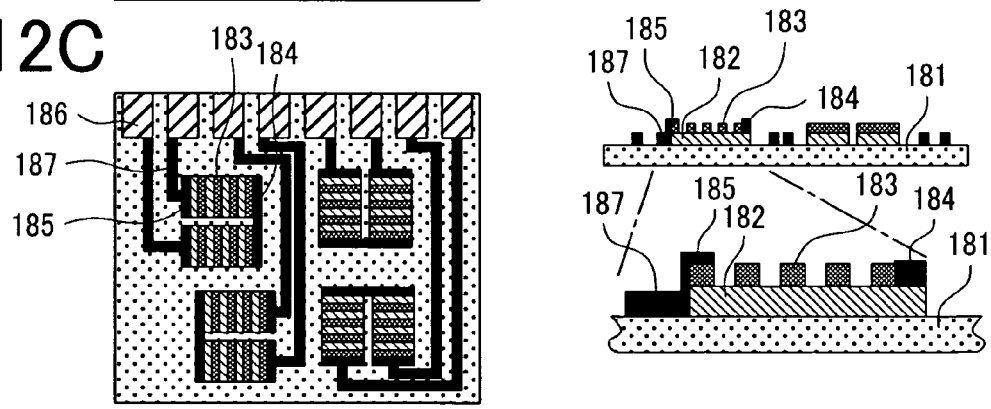

FIG. 12C shows the state where highly conductive layers 184, electrodes 185, connecting terminals 186 and wiring patterns 187 are printed using a highly conductive ink after curing of the actuator patterns 183. A sectional position thereof is the same as FIG. 12A. Its sectional view comprises an entire sectional view and an enlarged sectional view like FIG. 12B. As the highly conductive ink, the same highly conductive ink as that described above in the actuator module fabrication method in connection with FIG. 9 is used.

The highly conductive patterns 184 are each disposed so that two rectangular patters which constitute a unit pattern of actuator patterns 183 are connected at one ends thereof. For each unit pattern of actuator patterns 183, the wiring patterns 187 provide connections between the electrodes 185 printed on the side where the highly conductive layer 184 is not connected and the connecting terminals 186.

Figure 12D:
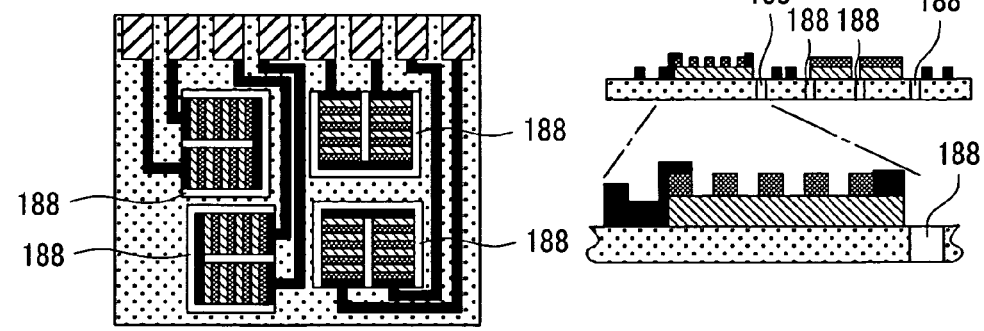

FIG. 12D shows the state where an actuator matrix module sheet 189 is completed with actuator units arranged in two rows by two columns. In the figure, the base sheet 181 is cut around the actuator patterns and along square U-shaped cutting portions 188 so as to provide a cantilever of a two rows by two columns unimorph structure with the base sheet 181 used as a base layer and actuator patterns 182 and 183 used as flexible layers. A sectional position thereof is the same as FIG. 12A. Its sectional view comprises an entire sectional view and an enlarged sectional view like FIG. 12B. The cutting operation is performed in such a manner that the unit pattern located in the first row and first column has a square U shape, the unit pattern located in the second row and first column has a shape resulting from 180° rotation of the U shape, the unit pattern located in the first row and second column has a shape resulting from 90° rotation of the U shape, and the unit pattern located in the second row and second column has a shape resulting from 270° rotation of the U shape. Although a cutting machine is used in the sixth embodiment, the cutting portions may be cut collectively by punching.

When voltage is applied from the connecting terminals so that an electric current flows in the actuator units, the actuator units of the first column are deformed in a convex shape above the central axis of the winding parallel to y axis and the actuator units of the second column are deformed in a convex shape above the central axis of the winding parallel to x axis. Thereafter, upon turning OFF of the supply of voltage, the actuator units revert to their original shapes. Thus, by adopting the actuator unit structure described in connection with FIG. 3 in the first embodiment, actuator units adapted to bend in various directions can be collectively fabricated on a single sheet.

In the sixth embodiment, the base sheet 181 is a planar sheet and an epoxy resin prepolymer and an epoxy curing agent, whose shrinkage after curing is ignorable, are used as the actuator ink. Thus, when the patterns are cut in a cantilever shape, each cantilever-shaped actuator unit does not bend and remains planar.

The actuator matrix module sheet 189 of the sixth embodiment is deformed so that a center angle becomes 70° under a driving voltage of 25 volts.

Also, in the sixth embodiment, if an actuator ink solution contains a solvent to decrease the concentration so that shrinkage after curing becomes large, a downwardly convex bend occurs when the patterns are cut in a cantilever shape. When voltage is applied to the actuator unit thus bent in a downwardly convex shape, the actuator unit is deformed in a planar direction.

Further, according to the structure shown in FIG. 12, as the actuator patterns 182, two rectangular patterns are arranged in parallel like those described above in connection with FIG. 6A, but such a square U-shaped actuator pattern as shown in FIG. 11 is used, like that described above in connection with FIG. 3. Even in this case, operation is ensured without any problem.

Although in the sixth embodiment the actuator patterns 183 are formed using the actuator ink for creating a striped thickness distribution in the flexible layers, the actuator patterns may be formed in accordance with the process of FIG. 12C using a highly conductive ink as in the fifth embodiment. In this case, the electrical resistance decreases as a whole and it is possible to keep the applied voltage low. Although in the sixth embodiment printing is performed in the order of actuators, wiring patterns and highly conducive layers, the printing order may be changed to the order of wiring patterns, highly conductive layers, and actuators.

Seventh Embodiment

Another method of fabricating an actuator matrix module sheet will now be described with reference to FIG. 13. As to the actuator matrix module sheet described in connection with FIG. 12, the base sheet 181 is cut after printing to fabricate a unimorph structure using the base sheet 181 as the base layer. In the seventh embodiment, however, a description will be given below about a method of fabricating an actuator matrix module sheet without cutting the base sheet 181.

FIGS. 13A to 13F are conceptual diagrams showing fabrication steps for actuator matrix module wherein the actuator unit described in connection with FIG. 3 in the first embodiment is disposed on a single sheet. In each of FIGS. 13A to 13F, the left side is a plan view (xy plane) and the right side is a sectional view (xz plane).

FIG. 13A shows the state where a sacrifice layer pattern 192 is printed on a base sheet 191 with use of a water-soluble ink. In its sectional view, the base sheet 191 with the sacrifice layer pattern 192 thereon is seen in the direction of arrows at a-a' position in the plan view. A polyimide film having a thickness of 0.025 mm is used for the base sheet 191. As the water-soluble ink, an aqueous solution of a water-soluble polymer is used such as, for example, polyvinyl alcohol. The sacrifice layer 192 is square in shape in which one side is 11 mm long.

FIG. 13B shows the state where a square U-shaped base layer pattern 193 is printed using an insulator ink after drying of the sacrifice layer pattern 192. A sectional position thereof is the same as FIG. 13A. As the insulator ink, a polyimide solution used for a polyimide resist in the semiconductor process is used after adjusting its viscosity for use in screen printing. The base layer pattern 193 has a square U-shaped outline of 10 mm square, with a space of 1 mm wide by 9 mm long being formed from the center of the left end. A vertical center in the figure of the base layer pattern 193 is coincident with that of the sacrifice layer pattern 192 and the base layer pattern 193 is disposed so that its left end overhangs 1 mm in the leftward direction.

FIG. 13C shows the state where, after drying of the base layer pattern 193, actuator patterns 194 are printed using an actuator ink which exhibits a large shrinkage rate after curing. A sectional position thereof is the same as FIG. 13A. The actuator patterns 194 are two rectangular patterns each 4.5 mm by 10 mm arranged in parallel vertically at an interval of 1 mm and are disposed so as to overlap with the base layer pattern 193.

FIG. 13D shows the state where, after curing of the actuator patterns 194, actuator patterns 195 are printed using the actuator ink so as to overlap with the actuator patterns 194. A sectional position thereof is the same as FIG. 13A. The actuator patterns 195 are rectangular patterns of 4.5 mm by 1 mm arranged in two rows by five columns at intervals of 1 mm in vertical and transverse directions in the figure. The actuator patterns 195 are arranged so as to overlap the actuator patterns 194.

FIG. 13E shows the state where a highly conductive layer 196, electrodes 197, wiring patterns 198 and connecting terminals 199 are printed collectively using a highly conductive ink after curing of the actuator patterns 195. A sectional position thereof is the same as FIG. 13A. The highly conductive layer 196 is a rectangular pattern of 4.5 mm by 1 mm and is disposed in such a manner that the two rectangular patterns which constitute the actuator patterns 194 are connected with each other at one ends thereof. The wiring patterns 198 provide connections between the electrodes 197 printed on the actuator patterns 194 on the side where the highly conductive layer 196 is not connected and the connecting terminals 199.

FIG. 13F shows the state where the base sheet 191 with patterns printed thereof is immersed in water to dissolve the sacrifice layer pattern 192 in water, thereby completing a cantilever type actuator of a unimorph structure comprising the base layer pattern 193 which is an insulating film pattern fixed at one end to the base sheet 191, the actuator patterns 194 and 195 and the highly conductive layer 196. A sectional position thereof is the same as FIG. 13A.

The actuator ink used in the seventh embodiment comprises an epoxy resin prepolymer and an epoxy curing agent, with carbon particles incorporated therein. However, there may be used a solution thereof in a fluorocarbon polymer or another organic polymer solvent such as polyester, with conductive particles such as carbon particles or silver particles incorporated therein. Moreover, in this seventh embodiment, an aqueous solution of a water-soluble polymer is used for forming the sacrifice layer pattern and lastly the same pattern is dissolved in water. However, if there is no adverse influence on the insulating film pattern, actuator patterns, electrodes and wiring patterns after curing, for example, polymethyl methacrylate resin, instead of the water-soluble polymer, may be used to form the sacrifice layer and lastly there may be used an organic solvent such as acetone to effect the dissolution. Further, although in the seventh embodiment printing is performed using the screen printing method, another printing method may be adopted such as offset printing or ink jet printing.

According to the manufacturing method described above in the seventh embodiment, actuator modules, including the electrode patterns, can be fabricated with high production efficiency and with little variations in performance among the actuator modules.

Eighth Embodiment

In the eighth embodiment, with reference to FIG. 14, a description will be given below about a conveying device sheet for conveying light-weight articles, e.g., paper, as an application mode of the bending type actuator module described in the first embodiment.

Figure 14:
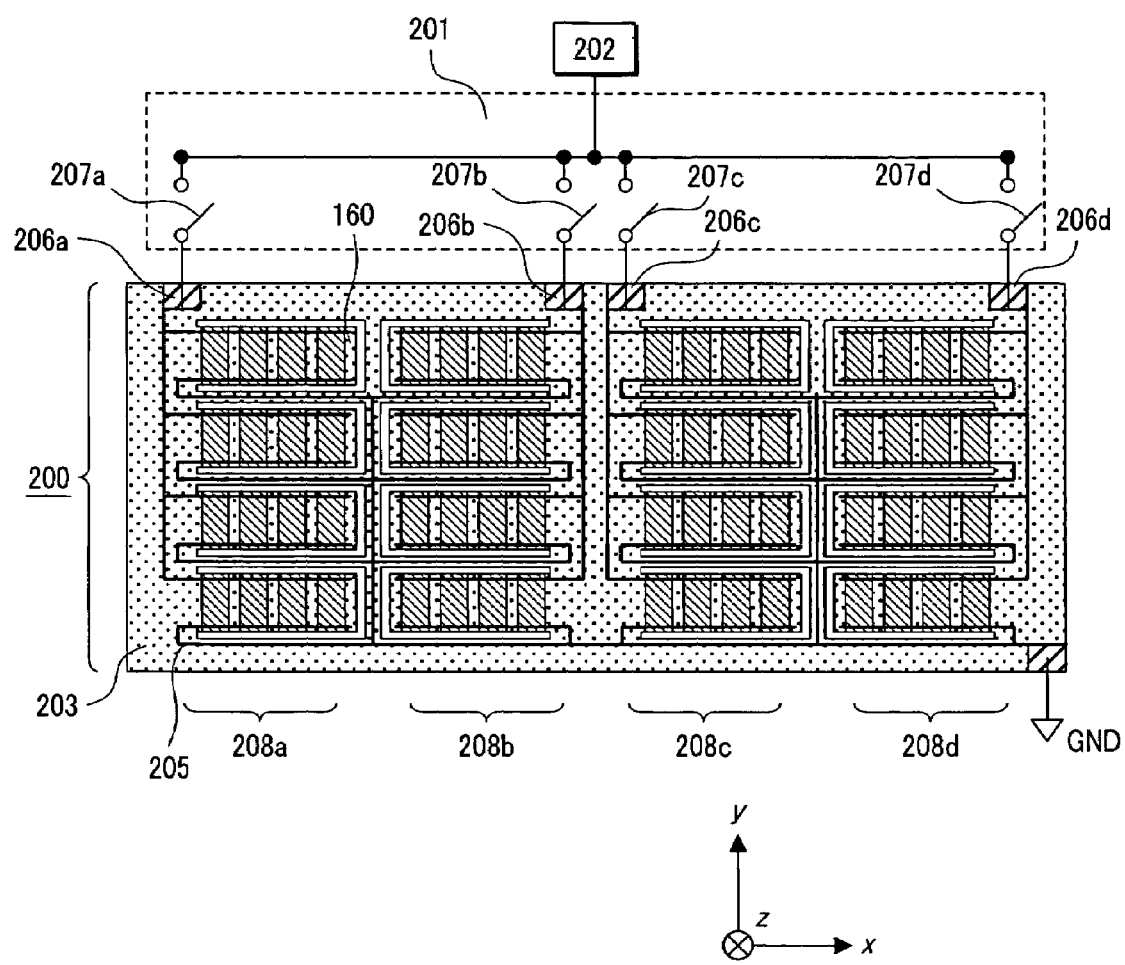
FIG. 14 is a conceptual top view showing a conveying device sheet with the actuator modules of FIG. 7A arranged in a matrix shape and connected in parallel for each row, as well as a conveying system that operates the sheet.

FIG. 14 is a conceptual diagram showing a conveying device sheet and a system for operating the same, the conveying device sheet utilizing in a plurality of the bending type actuator modules each having highly conductive layers on both sides thereof, which has been described above in connection with FIG. 7A. It goes without saying that the actuator module shown in FIG. 7A may be substituted by the one shown in FIG. 7C in which the highly conductive layers are provided on the base layer side.

FIG. 14 is a schematic diagram of a conveying system including the conveying device sheet and a control circuit therefor as seen from just above. The conveying system is made up of the conveying device sheet 200, a signal switching device 201, and a power controller 202. The conveying device sheet 200 is made up of a base layer 203, bending type actuator modules 160, wiring patterns 205, and voltage input terminals 206a, 206b, 206c and 206d. Bending type actuator modules 160 of a uniform size and each having highly conductive layers on both sides thereof, which has been described in the first embodiment, are arranged in a 4×4 matrix shape and on the base layer 203. In the bending type actuator modules 160, electrodes are mounted in the same direction for each column, and adjacent columns are disposed so that the mounting direction of the electrodes in one column is opposite to that in the other column. The highly conductive layers located on both sides of the bending type actuator modules 160 are joined to the wiring patterns 205 described on the base layer 203. The actuator modules 160 are electrically connected in parallel through the wiring patterns 205 for each column.

One terminals of the bending type actuator modules 160 are connected to the voltage input terminals 206a, 206b, 206c and 206d for each column, while the other terminals thereof are connected to a common ground GND. The voltage input terminals 206a, 206b, 206c and 206d are connected to the power controller 202 through the signal switching device 201 which is made up of switches 207a, 207b, 207c and 207d.

Figure 15:
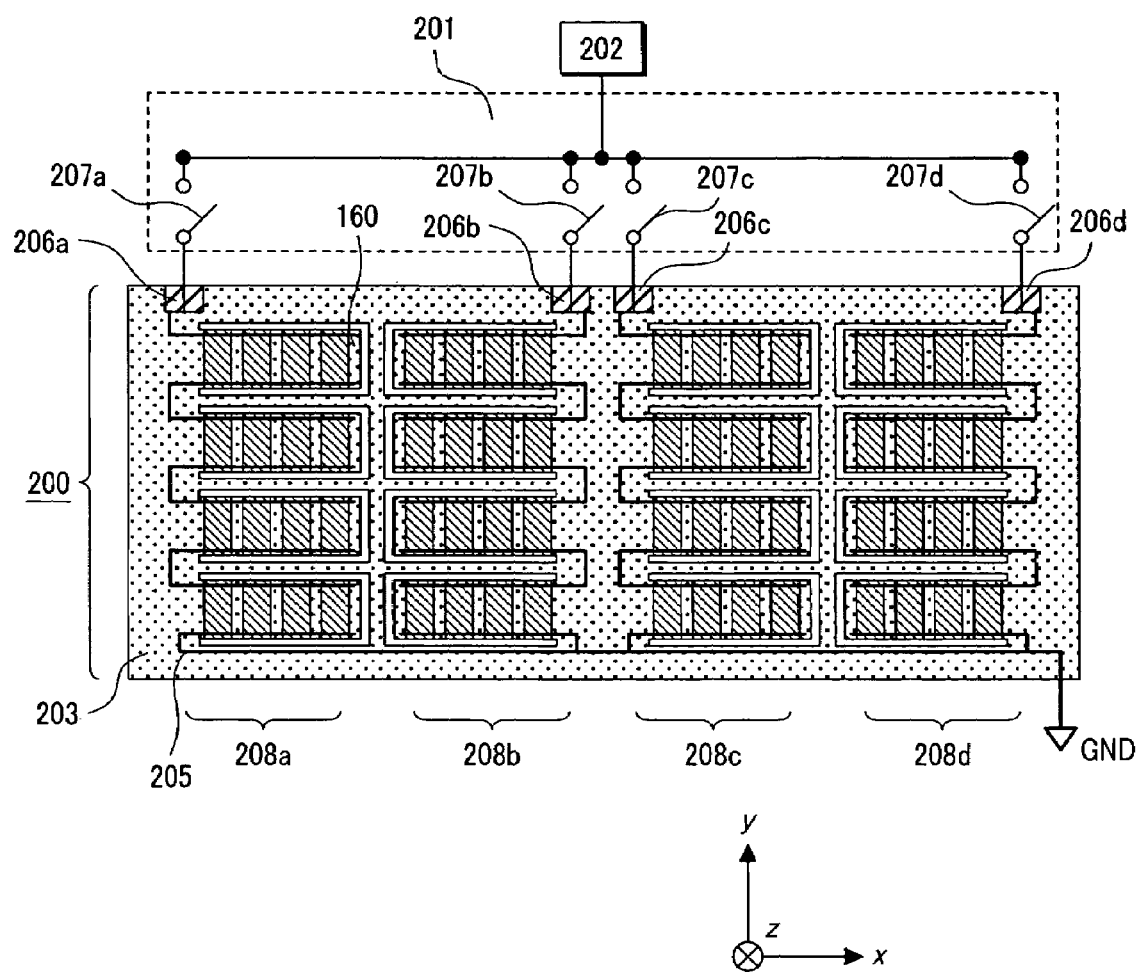
FIG. 15 is a conceptual to view showing a conveying device sheet with the actuator modules of FIG. 7A arranged in a matrix shape and connected in series for each row, as well as a conveying system that operates the sheet.

FIG. 15 is a conceptual diagram showing a conveying device sheet which utilizes a plurality of the bending type actuator modules described in connection with FIG. 7A and having highly conductive layers on both sides, and another system that operates the conveying device sheet. It goes without saying that the actuator module shown in FIG. 7A may be substituted by the one shown in FIG. 7C wherein the highly conductive layers are provided on the base layer side.

In the construction shown in FIG. 14, the actuator modules are connected in parallel column by column, while in the construction shown in FIG. 15 the actuator modules are connected in series column by column. Other points shown in FIG. 15 are the same as in FIG. 14. According to the construction shown in FIG. 15, since the electrical resistance of the actuator columns is high, the driving voltage is high. In addition, when a single actuator module is broken, all the actuator modules in the column in which the actuator module is broken cannot operate. However, there is an advantage that the wiring patterns are simplified.

In the conveying device sheet 200, the actuator portions, the highly conductive film portions and the wiring patterns can be easily fabricated simultaneously if the fabrication method by printing is adopted, which has been described above in connection with FIGS. 6 and 7.

FIGS. 16A to 16E illustrate how to convey an object using the constructions shown in FIGS. 14 and 15. In FIGS. 16A to 16E, a dot-dash line is provided on the right side of the object in order to easily understand the movement of the object to be conveyed. According to the constructions shown in FIGS. 14 and 15, since the actuator modules 160 bend so as to have the central axis of the bending parallel to y axis in the figures, the object is conveyed in x axis direction. In FIGS. 16A to 16E, the base layer 203 is connected to the ground GND for simplifying the figures.

FIG. 16A shows the state where the switches 207a, 207b, 207c and 207d are OFF and none of actuator columns 208a, 208b, 208c and 208d arranged on the base layer 203 are supplied with an electric current. The object to be conveyed, indicated by 209, lies on those plural actuator columns.

FIG. 16B shows the state where the actuator columns 208b and 208d are supplied with an electric current. The energized actuators bend and the object 209 is lifted by the actuator columns 208b and 208d. At this time, the object 209 moves in both z and x axis directions.

FIG. 16C shows a state of transition from the state of FIG. 16B. More particularly, FIG. 16C shows the state where the other actuator columns, i.e., the actuator columns 208a and 208c, are also supplied with an electric current and are thereby bent like the actuator columns 208b and 208d. At this time, the object 209 is lifted by all of the actuator columns 208a, 208b, 208c and 208d, but there is no movement of the object from the state of FIG. 16B.

FIG. 16D shows the state where the supply of an electric current to the actuator columns 208b and 208d is thereafter cut off and the object 209 is supported by the actuator columns 208a and 208c. Also in this state there is no movement of the object from the state of FIG. 16B.

FIG. 16E shows the subsequent power OFF state of the actuator columns 208a and 208c. As a result of interruption of the supply of an electric current to the actuator columns 208a and 208c, the actuator columns 208a and 208c revert to their original state and the object 209 moves in both -z and x directions. The distance of movement in x direction is as indicated by L.

Thus, by using the conveying system of this eighth embodiment, the object 209 can be conveyed in x direction through the steps shown in FIGS. 16A to 16E.

Figure 17:
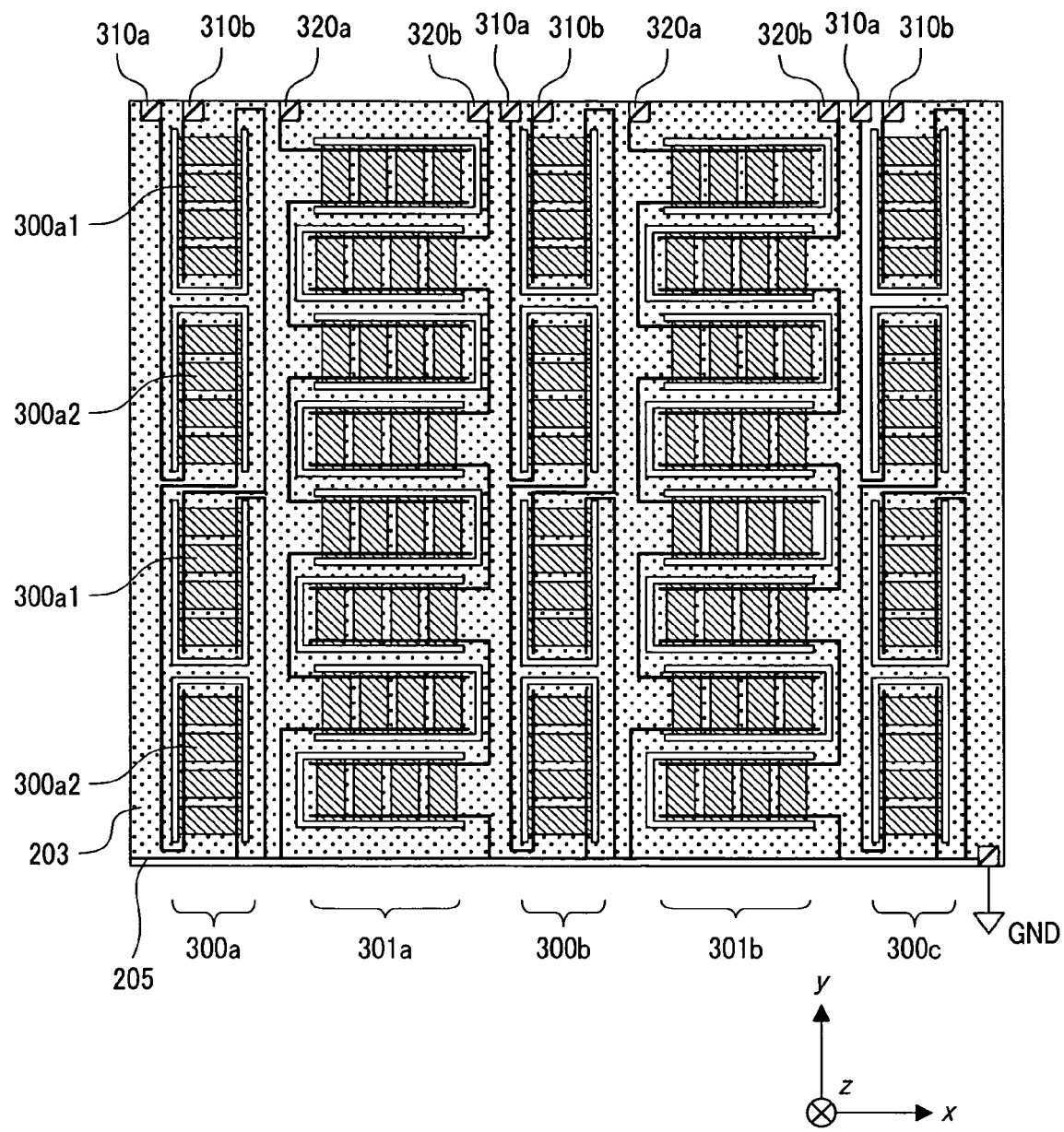
FIG. 17 is a conceptual top view of a conveying device sheet resulting from changing the layout of actuator modules on the conveying device sheet shown in FIG. 14 so as to permit conveyance in two directions.

FIG. 17 is a conceptual diagram showing a conveying device sheet 210 able to convey an object in both x and y directions, the conveying device sheet 210 comprising the conveying device sheet 200 shown in FIG. 15 and a device for conveying an object in y direction. According to the construction of the conveying device sheet 210, half of the actuator modules 160 included in the conveying device sheet 200 shown in FIG. 14 are turned 90°. In FIG. 17, actuator columns indicated by 300a, 300b and 300c are for conveying an object in y direction, while actuator columns indicated by 301a and 301b are for conveying the object in x direction.

An explanation about wiring patterns is here omitted. As to the actuator column 300a, actuators 300a1 and 300a2 bend alternately if voltages applied to voltage input terminals 310a and 310b is alternately switched. Also as to the actuator columns 300b and 300c, the actuators (their reference numerals are omitted) lying in those columns bend alternately if voltages applied to voltage input terminals 310a and 31b is switched alternately. In this way the actuators lying included in the actuator columns 300a, 300b and 300c bend alternately to convey the object in y direction. The actuator columns 301a and 301b bend as described above in connection with FIG. 16. In FIG. 17, actuators included in the actuator columns 301a and 301b bend alternately if voltages applied to voltage input terminals 320a and 320b is switched alternately. Thus, there is no difference in the point that the object is conveyed in x direction.

According to the construction shown in FIG. 17, an object can be conveyed freely in any direction on the surface of the base layer 203.

In this eighth embodiment, the actuators are made long in order to ensure a large displacement for conveyance in x or y direction. For this reason, the actuator module 160, which can be driven at a low voltage, is used even if the actuators are long. However, another type of an actuator module may also be used.

Since the bending type actuator module according to the present invention is light-weight and permits the reduction of size, it is possible to easily fabricate a light-weight conveying device sheet of a small occupancy area.

Ninth Embodiment

In this ninth embodiment, with reference to FIGS. 18 and 19, a description will be given below about a robot hand system as an application example using the bending type actuator module described in the first embodiment.

Figure 18A:
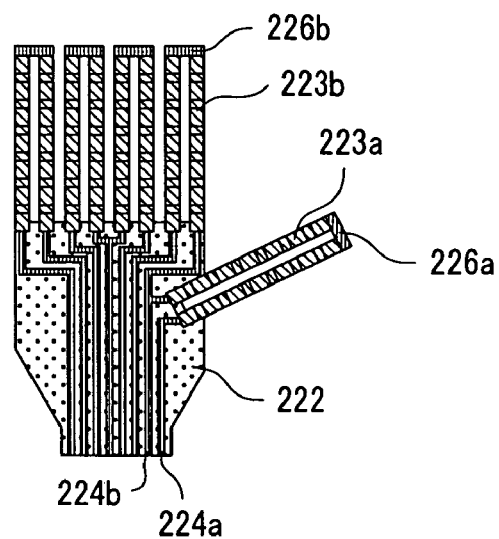
FIG. 18A is a conceptual front view of an actuator module sheet for a robot hand utilizing a plurality of the actuator module of FIG. 3
Figure 18B:
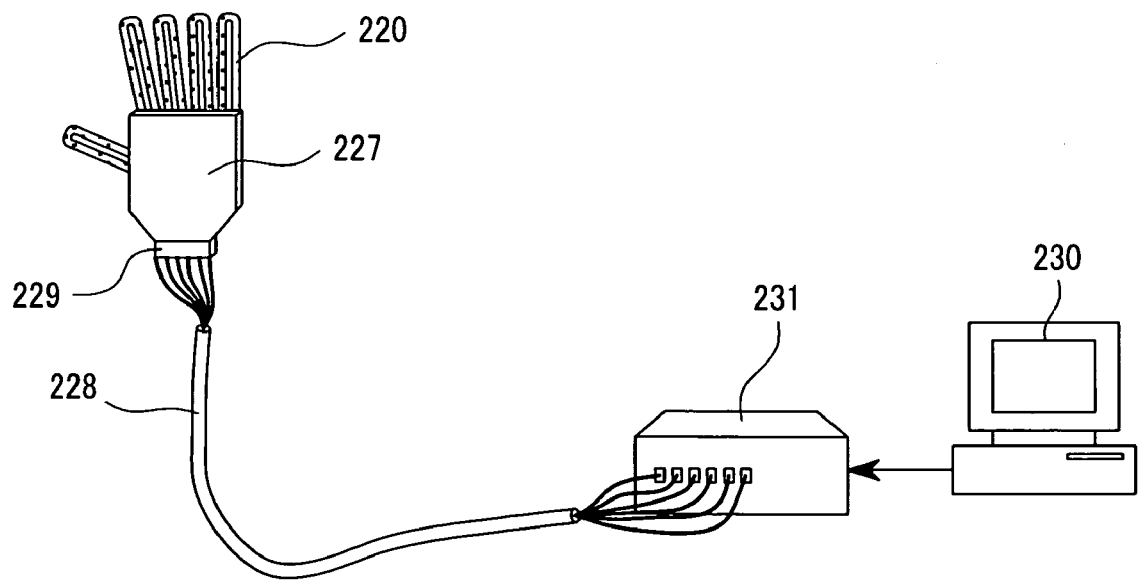
FIG. 18B is a conceptual diagram showing a robot hand system utilizing the actuator module sheet of FIG. 18A.

FIGS. 18A and 18B show a robot hand system imitating a human hand and applicable to a display system or the like. FIG. 18A is a conceptual diagram showing an actuator module sheet 220 serving as a robot hand finger portion and FIG. 18B is a conceptual diagram showing a robot hand system 221 able to perform motions similar to motions of a human hand.

In FIG. 18A, the actuator module sheet 220 is made up of a base layer 222, flexible layers 223a, 223b, . . . formed on the base layer 222, wiring lines 224a, 224b, . . . , and highly conductive layers 226a, 226b, . . . . The actuator module portion corresponding to robot hand fingers has the structure described above in connection with FIG. 3A. That is, the flexible layers 223a, 223b, . . . are each in a square U shape and have concaves and convexes with a film thickness, with the highly conductive layers 226a, 226b, . . . being joined to the tips of the flexible layers. The wiring lines 224a, 224b, . . . are formed so as to partially overlap with the flexible layers so that electric power can be supplied to the flexible layers.

As described in the fourth embodiment, actuators are doubly printed on the base layer 222 to make concaves and convexes, and wiring lines and highly conductive layers are printed on the base layer. After completion of all the printing operations, the base layer is cut in a hand shape along the actuator shape to fabricate the actuator module sheet 220.

In FIG. 18B, the robot hand system 221 includes the actuator module sheet 220, a resin plate 227 for holding the actuator module sheet 220, the resin plate 227 corresponding to the back of the hand, a cable 228 for the supply of electric power to the actuator module, a connector 229 for connection between the actuator module and the cable, a control unit 230 such as a central processing unit (CPU), and a drive signal generating unit 231 connected to the control unit 230.

The actuator module sheet 220 is fixed to the resin plate 227 in such a manner that the portion corresponding to fingers are positioned outside the resin plate 227, thereby permitting free motions of the actuator portions serving as fingers. The connector 229 connected to the power supply cable 228 is installed in the lower portion of the resin plate 227 to provide connections between the power supply cable 228 and the wiring lines 224a, 224b, . . . of the actuator module. The drive signal generating unit 231 is controlled in accordance with a command provided from the control unit 230 to provide voltage to required flexible layers. With these components, it is possible to easily fabricate a robot hand having five fingers each capable of being bent and stretched.

Figure 19A:
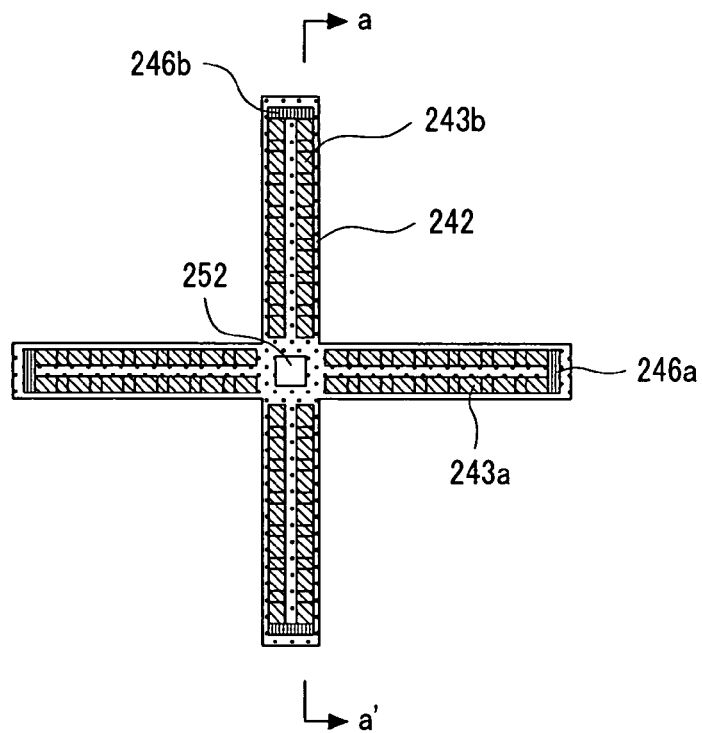
FIG. 19A is a conceptual front view of another actuator module sheet for a robot hand utilizing a plurality of the actuator module of FIG. 3.
Figure 19C:
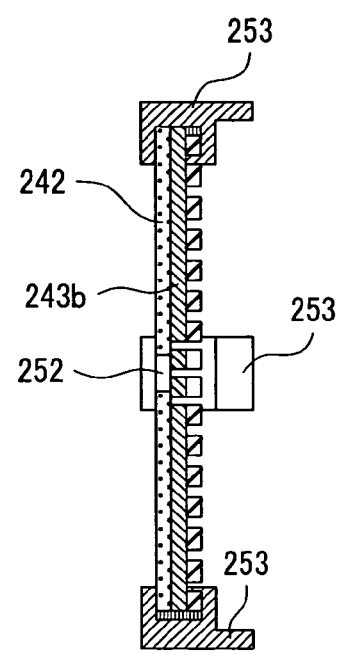
FIG. 19C is a conceptual sectional view showing the case where a pawl is provided at an end portion of each actuator in the actuator module sheet for a robot hand shown in FIG. 19A.
Figure 19B:
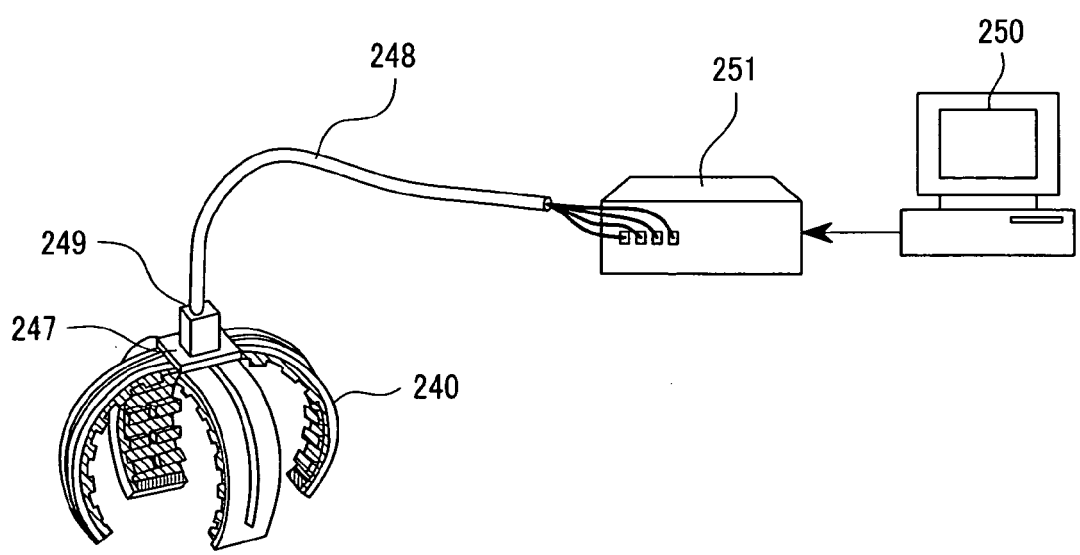
FIG. 19B is a conceptual diagram showing a robot hand system utilizing the actuator module sheet of FIG. 19A.

FIGS. 19A to 19C illustrate a robot hand system able to perform motions such as grabbing an object and carrying an object. FIG. 19A is a conceptual plan view of an actuator module sheet 240 to be used for a robot hand, FIG. 19B is a conceptual diagram of a robot hand system 241, and FIG. 19C is a sectional view showing a pawl (protective cover) provided at an end of the actuator module sheet (shown in FIG. 19A) used for a robot hand.

In FIG. 19A, the actuator module sheet 240 is made up of a base layer 242, flexible layers 243a, 243b, . . . formed on the base layer 242, and highly conductive layers 246a, 246b, . . . . The flexible layers 243a, 243b, . . . are of the structure shown in FIG. 3. That is, the flexible layers 243a, 243b, . . . are each in a square U shape having concaves and convexes with a film thickness and with the highly conductive layers 246a, 246b, . . . being joined to the tips of the flexible layers. The reference numeral 252 denotes an aperture. The aperture 252 is used to allow a resin plate 247 be joined to and hold the actuator module sheet 240 and provide a junction between the actuator module sheet 240 and electrodes formed on the resin plate 247. As described previously in the fourth embodiment, actuators are doubly printed on the base layer 242 to make concaves and convexes, and wiring lines and highly conductive layers are printed using metal ink. After completion of all the printing operations, the base layer is cut into a cross shape along the actuator shape to fabricate the actuator module sheet 240. Although input electrodes of the flexible layers are not shown in the drawings clearly, input electrodes are provided at positions close to the aperture 252 so that they can be connected to a power cable 248 as will be described later.

In FIG. 19B, the robot hand system 241 includes the actuator module sheet 140, the resin plate 247 for supporting the sheet 140, the cable 248 for the supply of electric power to the actuator module, a connector 249 for connection between the actuator module and the cable, a control unit 250 such as a central processing unit (CPU), and a drive signal generating unit 251 connected to the control unit. Electrodes are formed on the resin plate 247, whereby the actuator module sheet and the connector 249 formed on the resin plate 247 can be connected with each other. The connector 249 is connected to the power supply cable 248 and provide connections between the flexible layers 243a, 243b, . . . in the actuator module and the power cable 248. The drive signal generating unit 251 is controlled in accordance with a command provided from the control unit 250 and applies voltage to required flexible layers, whereby the four actuators can be bent or stretched each independently. Thus, a robot hand capable of grabbing an object can be realized easily.

FIG. 19C is a sectional view corresponding to a section as seen in the direction of arrows at a-a' position in FIG. 19A, with a pawl 253 being provided at the tip of each actuator piece in the actuator module sheet 240. The pawl 253 is for protection of the tip of each actuator piece when the actuator module sheet 240 is bent as in FIG. 19B and grabs an object. For example, the pawl 253 can be formed by placing liquid silicon into a molding flask, then inserting the actuator tip therein and solidifying the liquid silicon.

When the length of each robot hand finger in FIG. 19A is set to 2.5 cm and the flexible layers are formed using a composite material of carbon particles and epoxy resin to a thickness of 0.1 mm and the base insulating film is formed using polyimide to a thickness of 0.05 mm, an object having a weight of about 10 g or more can be grasped and lifted at a driving voltage of 30V.

A study will be made below about the operating for making the actuator module sheet bend and grasp an object and also about the grasping force.

As noted earlier, when a base layer having a bending habit is used, or when an actuator ink which exhibits a large shrinkage rate after curing as in FIG. 13 is used, a flexible layer is bent even without the supply of an electric current thereto, while when a base layer is in a planar state and an actuator ink whose shrinkage after curing is ignorable is used, a flexible layer is bent upon flowing an electric current therein. Thus, if a base layer having a bending habit is used as the base layer of the actuator module sheet 240 or if an actuator ink which exhibits a large shrinkage rate after curing is used, an electric current may flow in the flexible layers to widen the arms in an initial state of an object grasping operation, and after grasping the object, the supply of the electric current to the flexible layers may be cut off. On the other hand, if a planar base layer is used as the base layer of the actuator module sheet 240 and an actuator ink whose shrinkage after curing can be ignored is used, it is necessary that an electric current be fed to the flexible layers to bend the arms from the beginning of the object grasping operation up to the object grasping state.

As to the magnitude of the object grasping force, in all cases, an actuator in a bent shape acts as a c-shaped spring and an object is grasped with the force of the spring. The spring force is proportional to the size of deformation of the spring and a proportional constant thereof is called a spring constant. If the spring shape is the same, the spring constant depends on an elastic coefficient of the material which constitutes the spring. More particularly, the larger the elastic coefficient of the material, the stronger the spring. As to the elastic coefficient of the composite material used as the actuator material, there is a habit that the higher the temperature, the lower the elastic coefficient. Therefore, if a base layer having a bending habit is used as the base layer of the actuator module sheet 240 or an actuator ink which exhibits a large shrinkage rate after curing is used, and if the supply of an electric current to flexible layers is cut off after grasping an object, it follows that the object is being grasped at a low temperature, i.e., with a strong spring force. On the other hand, if a planar base layer is used as the base layer of the actuator module sheet 240 and an actuator ink whose shrinkage after curing can be ignored is used and if an electric current is allowed to flow in flexible layers when an object is grasped, it follows that the object is being grasped at a high temperature, i.e., with a weak spring force.

From the two viewpoints, it is more advantageous to adopt the actuator module sheet having the construction in which the flexible layers is bent in the absence of an electric current since it operates with small energy consumption and strong object grasping spring force.

Although four actuators are used in the example of FIG. 19, the number of actuators may be three or five or more.

Tenth Embodiment

Figure 20A:
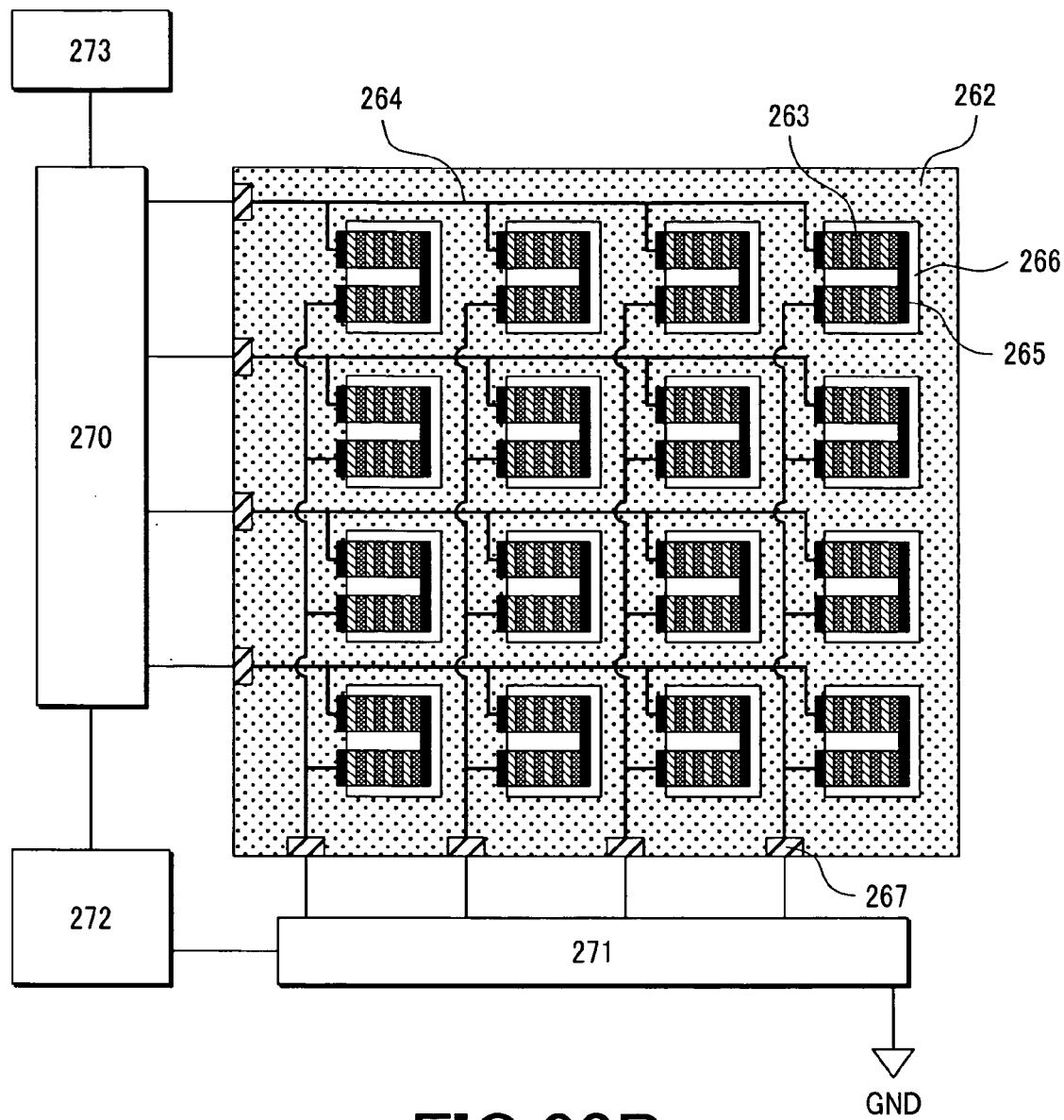
FIG. 20A is a conceptual diagram showing an actuator matrix module sheet for a pin matrix utilizing a plurality of the actuator module of FIG. 3
Figure 20B:
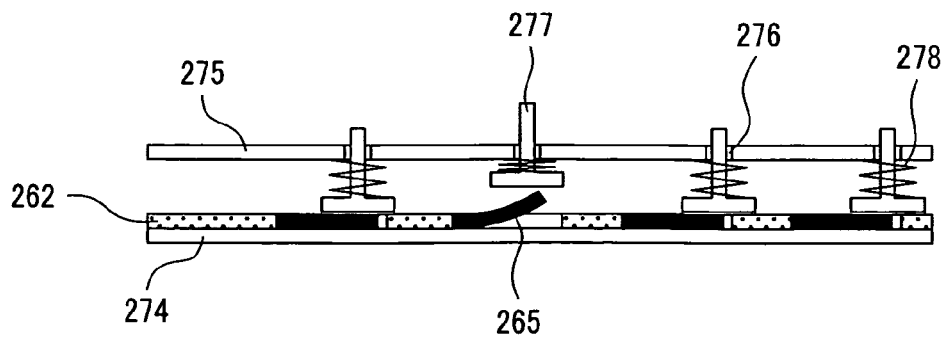
FIG. 20B is a sectional view showing the concept of a pin matrix utilizing the actuator matrix module sheet of FIG. 20A.

In this tenth embodiment, with reference to FIGS. 20A and 20B, a description will be given about a pin matrix applicable to, for example, a tactile display or a pin display as an application example using the bending type actuator module described in the first embodiment. FIG. 20A is a conceptual diagram showing an actuator matrix module sheet 260 for driving a pin matrix, and FIG. 20B is a conceptual side view showing the operation state of a pin matrix 261 using the actuator matrix module sheet 260.

In FIG. 20A, the actuator matrix module sheet 260 is made up of a base layer 262, flexible layers 263 formed on the base layer 262, wiring lines 264, and highly conductive layers 266. Each actuator unit 265 has the structure described above in connection with FIG. 3. That is, each flexible layer 263 is in a square U shape and has concaves and convexes with a film thickness, with a highly conductive layer 266 joined to an end opposite to the open side of the flexible layer. The actuator units 265 are arranged in a simple 4×4 matrix form. The wiring lines are connected for each row and for each column and are connected to four electrodes 267. The electrodes in the rows are input to a scan circuit 270, while the electrodes in the columns are input to a data circuit 271. The scan circuit 270 is connected to a power supply 273, while the data circuit 271 is connected to ground, both being controlled by a control unit 272.

The operation of each actuator unit 265 is controlled by a dynamic driving system. More specifically, the initial row is activated by the scan circuit 270 and at the same time data of the column corresponding to an actuator unit 265, which is located in that row and is to be moved, is activated by the data circuit 271. As a result, voltage is supplied to the actuator unit 265 in an arbitrary column in the initial row, causing the actuator unit to bend. Then, the next row is activated and data is set in the same manner. Since the response of the actuator unit 265 used is 100 Hz or lower, it is possible to operate an arbitrary actuator unit by repeating this operation at high speed.

As described in the fourth embodiment, the flexible layers, wiring lines and highly conductive layers are formed by printing and the base layer is cut along the actuator shape to fabricate the actuator matrix module sheet 260.

In FIG. 20B, the actuator matrix module sheet 260 is fixed to a substrate 274 while the flexible layer is on the lower side. In this case, the actuator module portion is made movable instead of being fixed. A pin substrate 275 is placed above the actuator module portion while leaving a space. The pin substrate 275 has 4×4 through holes 276 and pins 277 are provided each extending through the through hole 276. Lower portions of the pins 277 are joined to the tips of the actuator units 265 so as to be pushed up upon bending of the actuator units. Weak springs 278 are disposed between the lower portions of the pins 277 and the pin substrate 275 to prevent unnecessary vibrations of the pins 277.

In FIG. 20A, each actuator unit is fabricated with the size of 1 cm square using a polyimide film with a thickness of 0.05 mm as the base layer and using a composite material film with a thickness of 0.1 mm made up of carbon particles and epoxy resin as the flexible layer. As a result, each pin can be pushed up 2 mm at a driving voltage of 10V.

Explanation of reference numerals used in the drawings that is attached to the specification is as follows:

1 . . . flexible layer, 2 . . . base layer, 10 . . . actuator, 100 . . . actuator module, 101, 101' . . . flexible layer, 102 . . . base layer, 103, 104 . . . electrode, 106 . . . power supply, 110 . . . actuator module, 115, 115*a*, 115*b* . . . multi-layer film 116, 116a, 116b . . . highly conductive layer, 117 . . . flexible layer, 120 . . . actuator module, 130 . . . actuator module, 137 . . . resin layer, 140 . . . actuator module, 159a, 159b, 159c . . . aperture, 160 . . . actuator module, 161 . . . base sheet, 162 . . . actuator pattern, 163 . . . highly conductive layer, 164 . . . electrode, 166 . . . connecting terminal, 167 . . . wiring pattern, 168 . . . square U-shaped cutting portion, 169 . . . actuator matrix module, 171 . . . base sheet, 172 . . . base layer pattern, 173 . . . actuator pattern, 174 . . . highly conductive layer, 175 . . . electrode, 176 . . . connecting terminal, 177 . . . wiring pattern, 178 . . . square U-shaped cutting portion, 179 . . . actuator matrix module sheet, 181 . . . base sheet, 182, 183 . . . actuator pattern, 184 . . . highly conductive layer, 185 . . . electrode, 186 . . . connecting terminal, 187 . . . wiring pattern, 188 . . . square U-shaped cutting portion, 189 . . . actuator matrix module sheet, 191 . . . base sheet, 192 . . . sacrifice layer pattern, 193 . . . base layer pattern, 194, 195 . . . actuator pattern, 196 . . . highly conductive layer, 197 . . . electrode, 198 . . . wiring pattern, 199 . . . connecting terminal, 200 . . . conveying device sheet, 201 . . . signal switching device, 202 . . . power controller, 203 . . . base layer, 205 . . . wiring pattern, 206a, 206b, 206c, 206d . . . voltage input terminal, 207a, 207b, 207c, 207d . . . switch, 208a, 208b, 208c, 208d . . . actuator column, 209 . . . object, 210 . . . conveying device sheet, 220 . . . actuator module sheet, 221 . . . robot hand system, 222 . . . base layer, 223 . . . flexible layer, 224 . . . wiring line, 226 . . . highly conductive layer, 227 . . . resin plate, 228 . . . cable, 229 . . . connector, 230 . . . control unit, 231 . . . driving signal generating unit, 240 . . . actuator module sheet, 241 . . . robot hand system, 242 . . . base layer, 243 . . . flexible layer, 246 . . . highly conductive layer, 247 . . . resin plate, 248 . . . cable, 249 . . . connector, 250 . . . control unit, 251 . . . drive signal generating unit, 252 . . . aperture, 253 . . . pawl, 260 . . . actuator matrix module sheet, 261 . . . pin matrix, 262 . . . base layer, 263 . . . flexible layer, 264 . . . wiring line, 265 . . . actuator unit, 266 . . . highly conductive layer, 267 . . . electrode, 270 . . . scan circuit, 271 . . . data circuit, 272 . . . controller, 273 . . . power supply, 274 substrate, 275 . . . pin substrate, 276 . . . through hole, 277 . . . pin, 278 . . . spring, 300a, 330b, 300c, 301a, 301b . . . actuator column, 300a1, 300a2 . . . actuator, 310a, 310b, 320a, 320b . . . voltage input terminal

What is claimed is:

1. An actuator unit comprising:
   a multi-layer film including a flexible layer and a base layer joined to the flexible layer, the flexible layer being formed of a material adapted to expand and contract based on electric signals, the material containing conductive particles and a binder material, and the base layer being formed of a material smaller in coefficient of linear thermal expansion than the flexible layer; and
   two input electrodes formed at both end portions of the flexible layer to apply a voltage to the flexible layer,
   wherein the multi-layer film has a structure such that an anisotropic internal stress distribution is induced within the multi-layer film upon application of voltage to the input electrodes.

2. An actuator unit according to claim 1, wherein:
   the anisotropic internal stress distribution induced within the multi-layer film is induced by a thickness distribution of the multi-layer film; and
   the thickness distribution of the multi-layer film is in a striped form and the multi-layer film bends in a cylindrical shape with the central axis of the bending that is parallel to the direction of the stripe.

3. An actuator unit according to claim 2, wherein the thickness distribution of the multi-layer film is induced by a thickness distribution of the flexible layer.

4. An actuator unit according to claim 2, wherein the thickness distribution of the multi-layer film is induced by a thickness distribution of the base layer.

5. An actuator unit according to claim 1, wherein:
   the multi-layer film is formed in a square U shape, the input electrodes are formed on the side of an open end of the square U-shaped multi-layer film; and
   a highly conductive layer is formed on the side opposite to the open end of the flexible layer of the square U-shaped multi-layer film, the highly conductive layer having an electrical conductivity larger than that of the flexible layer.

6. An actuator unit according to claim 5, wherein a portion of the square U-shaped multi-layer film on which the highly conductive layer is formed is cut out.

7. An actuator unit according to claim 5, wherein, the base layer is continuous also in an intermediate portion of the square U shaped multi-layer film.

8. An actuator unit according to claim 1, wherein on a surface of the base layer opposite to the surface on which the flexible layer is formed, another flexible layer different in polarity of thermal expansion from the flexible layer joined to the base layer is formed.

9. An actuator unit comprising:
   a multi-layer film including a flexible layer and a base layer joined to the flexible layer, the flexible layer being formed of a material adapted to expand and contract based on electric signals, the material containing conductive particles and a binder material, and the base layer being formed of a material smaller in coefficient of linear thermal expansion than the flexible layer; and
   two input electrodes formed at both end portions of the flexible layer to apply a voltage to the flexible layer,
   wherein:
   the actuator unit is bent into a cylindrical form,
   the flexible layer is disposed on the base layer while being divided in a direction parallel to an axis of the cylindrical form into sub-layers and being electrically insulated;
   the input electrodes are disposed on an end portion of the base layer; and
   highly conductive layers having an electrical conductivity larger than that of the flexible layer are connected to the input electrodes and further connected to both end portions of each of the divided and electrically insulated flexible layers.

10. An actuator unit according to claim 9, wherein the highly conductive layers are disposed between the base layer and the input electrodes, as well as said flexible layer.

11. An actuator unit according to claim 10, wherein the base layer portion located between the highly conductive layers is cut out.

12. An actuator unit according to claim 2, wherein the base layer has a bending habit, the bending habit tending to bend in the same direction as the direction in which the multi-layer film bends due to the anisotropic internal stress distribution induced within the multi-layer film.

13. An actuator unit according to claim 2, wherein the base layer has a bending habit, the bending habit tending to bend in the direction opposite to the direction in which the multi-layer film bends due to the anisotropic internal stress distribution induced within the multi-layer film with respect to a surface of the multi-layer film.

14. An actuator unit according to claim 1, wherein the flexible layer is disposed on the base layer and formed with concaves and convexes thereon.

15. An actuator unit according to claim 1, wherein the multi-layer film between the two input electrodes is curved or bent by applying a voltage to the input electrodes.

16. An actuator unit according to claim 9, wherein the multi-layer film between the two input electrodes is curved or bent by applying a voltage to the input electrodes.

* * * * *